United States Patent
Komiyama et al.

(10) Patent No.: US 12,453,110 B2
(45) Date of Patent: Oct. 21, 2025

(54) SEMICONDUCTOR DEVICE

(71) Applicant: FUJI ELECTRIC CO., LTD., Kawasaki (JP)

(72) Inventors: Norihiro Komiyama, Matsumoto (JP); Masahiro Sasaki, Azumino (JP); Yuichi Onozawa, Matsumoto (JP); Shoji Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 405 days.

(21) Appl. No.: 18/188,452

(22) Filed: Mar. 22, 2023

(65) Prior Publication Data

US 2023/0231043 A1    Jul. 20, 2023

Related U.S. Application Data

(63) Continuation of application No. PCT/JP2022/017660, filed on Apr. 13, 2022.

(30) Foreign Application Priority Data

Apr. 20, 2021    (JP) .................................. 2021-071267

(51) Int. Cl.
| | |
|---|---|
| *H10D 12/00* | (2025.01) |
| *H10D 62/10* | (2025.01) |
| *H10D 62/17* | (2025.01) |

(52) U.S. Cl.
CPC ......... *H10D 12/481* (2025.01); *H10D 62/126* (2025.01); *H10D 62/393* (2025.01)

(58) Field of Classification Search
CPC ... H10D 12/481; H10D 62/126; H10D 62/393
(Continued)

(56) References Cited

U.S. PATENT DOCUMENTS

| 5,942,909 A | 8/1999 | Shiyu |
|---|---|---|
| 2009/0184338 A1 | 7/2009 | Hisamoto |

(Continued)

FOREIGN PATENT DOCUMENTS

| JP | H0918010 A | 1/1997 |
|---|---|---|
| JP | H10107107 A | 4/1998 |

(Continued)

OTHER PUBLICATIONS

Office Action issued for counterpart Japanese Application No. 2023-515428, transmitted from the Japanese Patent Office on Apr. 16, 2024 (drafted on Apr. 9, 2024).

(Continued)

*Primary Examiner* — Igwe U Anya

(57) ABSTRACT

Provided is a semiconductor device including: a semiconductor substrate having an upper surface and a lower surface and having a drift region of a first conductivity type; a first main terminal provided above the upper surface; a second main terminal provided below the lower surface; a control terminal configured to control whether or not to cause a current to flow between the first main terminal and the second main terminal; and a buffer region provided between the drift region and the lower surface and having a higher doping concentration than the drift region. In a C-V characteristic indicating a relationship between a power supply voltage applied between the first main terminal and the second main terminal and an inter-terminal capacitance between the control terminal and the second main terminal, a region where the power supply voltage is 500 V or more has a peak of the inter-terminal capacitance.

20 Claims, 23 Drawing Sheets

(58) Field of Classification Search
USPC .......................................................... 257/330
See application file for complete search history.

(56) References Cited

U.S. PATENT DOCUMENTS

| | | | | |
|---|---|---|---|---|
| 2009/0283825 | A1* | 11/2009 | Wang | H10D 64/027 257/E29.256 |
| 2014/0299915 | A1 | 10/2014 | Kenji | |
| 2015/0123165 | A1 | 5/2015 | Omura | |
| 2016/0197143 | A1 | 7/2016 | Naito | |
| 2016/0254372 | A1 | 9/2016 | Kawase | |
| 2017/0141216 | A1 | 5/2017 | Abe | |
| 2018/0053655 | A1 | 2/2018 | Kawase | |
| 2019/0312105 | A1 | 10/2019 | Sakurai | |
| 2020/0194550 | A1 | 6/2020 | Baburske | |
| 2021/0005744 | A1* | 1/2021 | Ebihara | H10D 62/111 |

FOREIGN PATENT DOCUMENTS

| | | | | |
|---|---|---|---|---|
| JP | H11163312 | A | 6/1999 | |
| JP | 2003338626 | A | 11/2003 | |
| JP | 2009176882 | A | 8/2009 | |
| JP | 2013055098 | A | 3/2013 | |
| JP | 2013138172 | A | 7/2013 | |
| JP | 2019186312 | A | 10/2019 | |
| JP | 2020109808 | A * | 7/2020 | .......... H10D 30/668 |
| WO | 2013180186 | A1 | 12/2013 | |
| WO | 2015087439 | A1 | 6/2015 | |
| WO | 2015093190 | A1 | 6/2015 | |
| WO | 2016125490 | A1 | 8/2016 | |
| WO | 2016203545 | A1 | 12/2016 | |

OTHER PUBLICATIONS

International Search Report and (ISA/237) Written Opinion of the International Search Authority for International Patent Application No. PCT/JP2022/017660, mailed by the Japan Patent Office on Jul. 12, 2022.

Takashi Masuhara et al., "Development of an Accurate Spice Model for a new 1.2-kV SiC-MOSFET device", Proceedings of PCIM Europe digital days 2020, Jul. 7-8, 2020, pp. 407-410.

Office Action issued for counterpart Japanese Application No. 2023-515428, transmitted from the Japanese Patent Office on Sep. 3, 2024. (drafted on Aug. 27, 2024).

* cited by examiner

SEMICONDUCTOR DEVICE

The contents of the following Japanese patent application(s) are incorporated herein by reference:
NO. 2021-071267 filed in JP on Apr. 20, 2021
NO. PCT/JP2022/017660 filed in WO on Apr. 13, 2022

BACKGROUND

1. Technical Field

The present invention relates to a semiconductor device.

2. Related Art

Conventionally, a semiconductor device including a buffer region functioning as a field stop layer is known (see, for example, Patent Document 1).
Patent Document 1: WO2016/203545

DESCRIPTION OF EXEMPLARY EMBODIMENTS

Figure 1A:
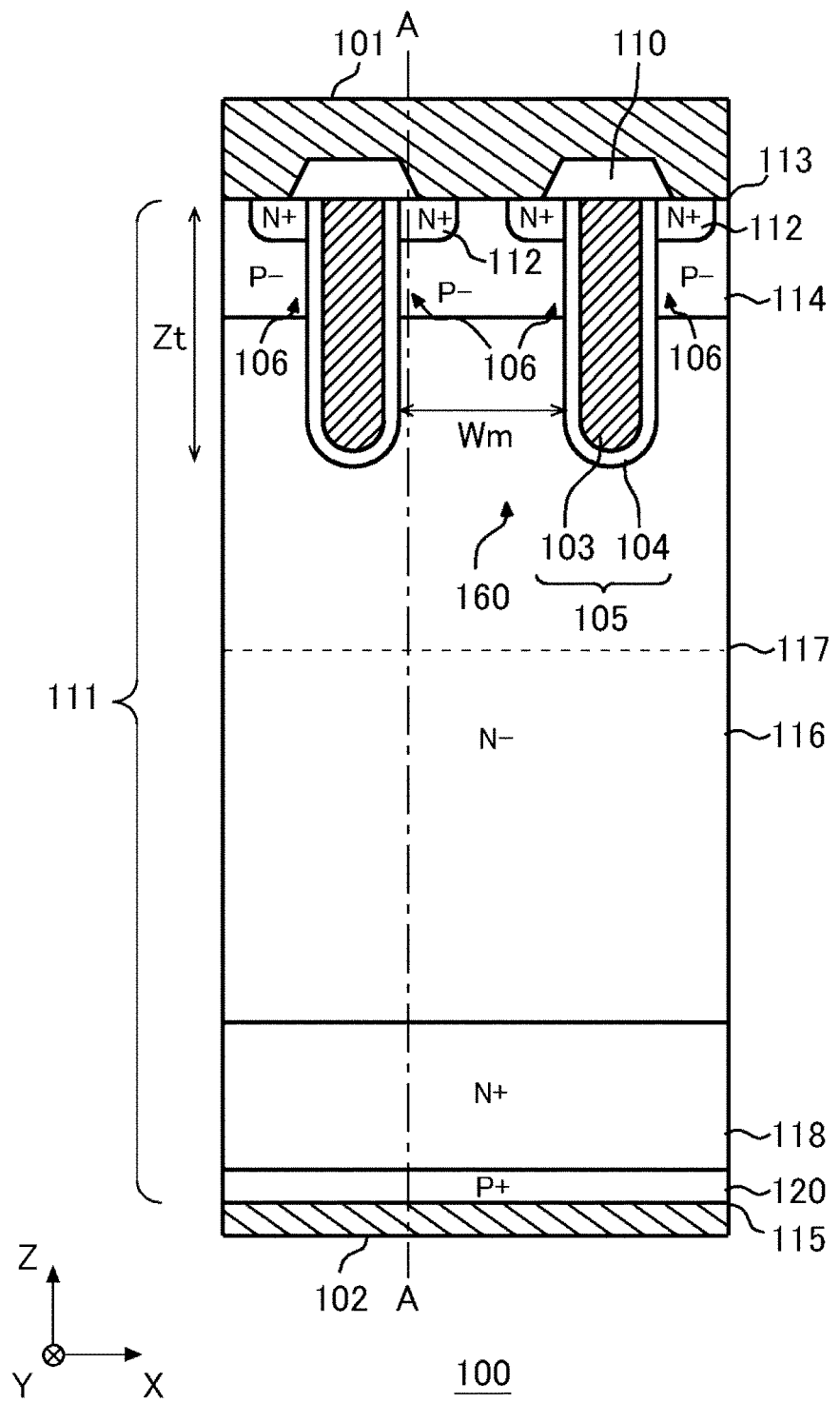
FIG. 1A is a cross-sectional view illustrating an example of a semiconductor device 100 to be analyzed.

Hereinafter, the invention will be described through embodiments of the invention, but the following embodiments do not limit the invention according to claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are defined as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction. In the case of referring to an upper surface side of the semiconductor substrate in the present specification, the upper surface side indicates a region from the center to the upper surface in the depth direction of the semiconductor substrate. In the case of referring to a lower surface side of the semiconductor substrate, the lower surface side indicates a region from the center to the lower surface in the depth direction of the semiconductor substrate.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D - N_A$.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

A chemical concentration in the present specification indicates an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV profiling). In addition, a carrier density measured by a spreading resistance profiling method (SRP method) may be used as the net doping concentration. It may be assumed that the carrier density measured by the CV method or the SRP method is a value in a thermal equilibrium state. In addition, in a region of the N type, the donor concentration is sufficiently higher than the acceptor concentration, and thus the carrier density in the region may be used as the donor concentration. Similarly, in a region of the P type, the carrier density of the region may be used as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping.

The carrier density measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier density measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1A is a cross-sectional view illustrating an example of a semiconductor device 100 to be analyzed. The semiconductor device 100 of this example includes a transistor element such as an insulated gate bipolar transistor (IGBT). However, the structure of the semiconductor device 100 is not limited to the structure of FIG. 1A. The semiconductor device 100 includes a semiconductor substrate 111, a first main terminal 101, a second main terminal 102, and an interlayer dielectric film 110. In addition, a control terminal 103 is provided inside the semiconductor substrate 111. The control terminal 103 controls whether or not a main current flows between the first main terminal 101 and the second main terminal 102 by an applied voltage. The control terminal 103 is, for example, a gate terminal or a base terminal of the transistor element. The first main terminal 101 and the second main terminal 102 are terminals through which a main current flows. The first main terminal 101 is, for example, an emitter terminal or a source terminal of the transistor element. The second main terminal 102 is, for example, a collector terminal or a drain terminal of the transistor element. The first main terminal 101 of this example is an emitter electrode, and the second main terminal 102 is a collector electrode. The first main terminal 101 and the second main terminal 102 are formed of a metal material such as aluminum.

The semiconductor substrate 111 is a substrate formed of a semiconductor material such as silicon or a compound semiconductor material such as silicon carbide or gallium arsenide. The semiconductor substrate 111 may be formed by a magnetic field applied CZ (MCZ) method. The semiconductor substrate 111 may have a wafer shape including a plurality of chips, or may have a singulated chip shape. The semiconductor substrate 111 has an upper surface 113 and a lower surface 115. The semiconductor device 100 of this example is a vertical device in which the first main terminal 101 is provided above the upper surface 113 and the second main terminal 102 is provided below the lower surface 115.

The semiconductor substrate 111 of this example includes a gate structure portion 105, an emitter region 112, a base region 114, a drift region 116, a buffer region 118, and a collector region 120. The drift region 116 is a region of a first conductivity type (N− type in this example). The emitter region 112 is disposed between the drift region 116 and the upper surface 113. The emitter region 112 is a contact region of the N+ type in contact with the first main terminal 101. The base region 114 is a contact region of a second conductivity type (P− type in this example) in contact with the first main terminal 101. At least partial region of the base region 114 is disposed between the emitter region 112 and the drift region 116. In this example, the first conductivity type is the N type and the second conductivity type is the P type, but the conductivity types may be reversed.

The collector region 120 is a region of the P+ type provided in contact with the lower surface 115. The collector region 120 is electrically connected to the second main terminal 102. The buffer region 118 is a region of N+ type provided between the collector region 120 and the drift region 116. The doping concentration of the buffer region 118 is higher than the doping concentration of the drift region 116. The buffer region 118 functions as a field stop layer that prevents a depletion layer 117 expanding from the upper surface 113 side from reaching the collector region 120.

The gate structure portion 105 is provided at a position facing the base region 114 between the emitter region 112 and the drift region 116. The gate structure portion 105 of this example is a trench type provided from the upper surface 113 of the semiconductor substrate 111 to the drift region 116 through the emitter region 112 and the base region 114. The gate structure portion 105 of this example is an example of a trench portion. A depth from the upper surface 113 to the lower end of the gate structure portion 105 is defined as Zt (cm). The gate structure portion 105 of another example may be a planner type provided above the upper surface 113 of the semiconductor substrate 111.

The gate structure portion 105 is insulated from the first main terminal 101 by the interlayer dielectric film 110. The gate structure portions 105 are repeatedly disposed at predetermined intervals in a predetermined arrangement direction (the X axis direction in the example of FIG. 1A).

The gate structure portion 105 includes a gate dielectric film 104 and the control terminal 103. The control terminal 103 of this example is a gate electrode. The control terminal 103 may be formed of a conductive material such as polysilicon. The control terminal 103 and the base region 114 are provided to face each other at least partially.

The gate dielectric film 104 may be a film formed by thermally oxidizing or thermally nitriding the semiconductor substrate 111. The gate dielectric film 104 insulates the control terminal 103 from the semiconductor substrate 111. In the base region 114, a region which is in contact with the gate dielectric film 104 and is disposed to face the control terminal 103 across the gate dielectric film 104 is referred to as a channel region 106. By applying a predetermined control voltage to the control terminal 103, an inversion layer channel having an inverted conductivity type is formed in the channel region 106 of the base region 114. As a result, the emitter region 112 and the drift region 116 are connected by the inversion layer channel, and a current flows.

The semiconductor substrate 111 of this example has a mesa portion 160. The mesa portion 160 is a portion sandwiched between two gate structure portions 105 in the semiconductor substrate 111. The position of the upper end of the mesa portion 160 of this example is the same as the position (that is, the upper surface 113) of the upper end of the gate structure portion 105, and the position of the lower end of the mesa portion 160 is the same as the position of the lower end of the gate structure portion 105. The width of the mesa portion 160 in the arrangement direction of the gate structure portion 105 is defined as Wm (cm). A width Wm of the mesa portion 160 corresponds to a distance between two gate structure portions 105 adjacent to each other in the X axis direction. The width Wm of the mesa portion 160 may be measured on the upper surface 113 of the semiconductor substrate 111.

In the present specification, a state where the inversion layer channel is formed in the channel region 106 of the base region 114 may be referred to as an on state, and a state where the inversion layer channel is not formed may be referred to as an off state. In addition, a direction perpendicular to a direction (the Z axis direction in the example of FIG. 1A) in which a current flows in the inversion layer channel and perpendicular to a direction (the X axis direction in the example of FIG. 1A) in which the base region 114 and the control terminal 103 face each other is referred to as a channel length direction (the Y axis direction in the example of FIG. 1A). The length of the channel region 106 in the channel length direction is referred to as a channel length.

Figure 1B:
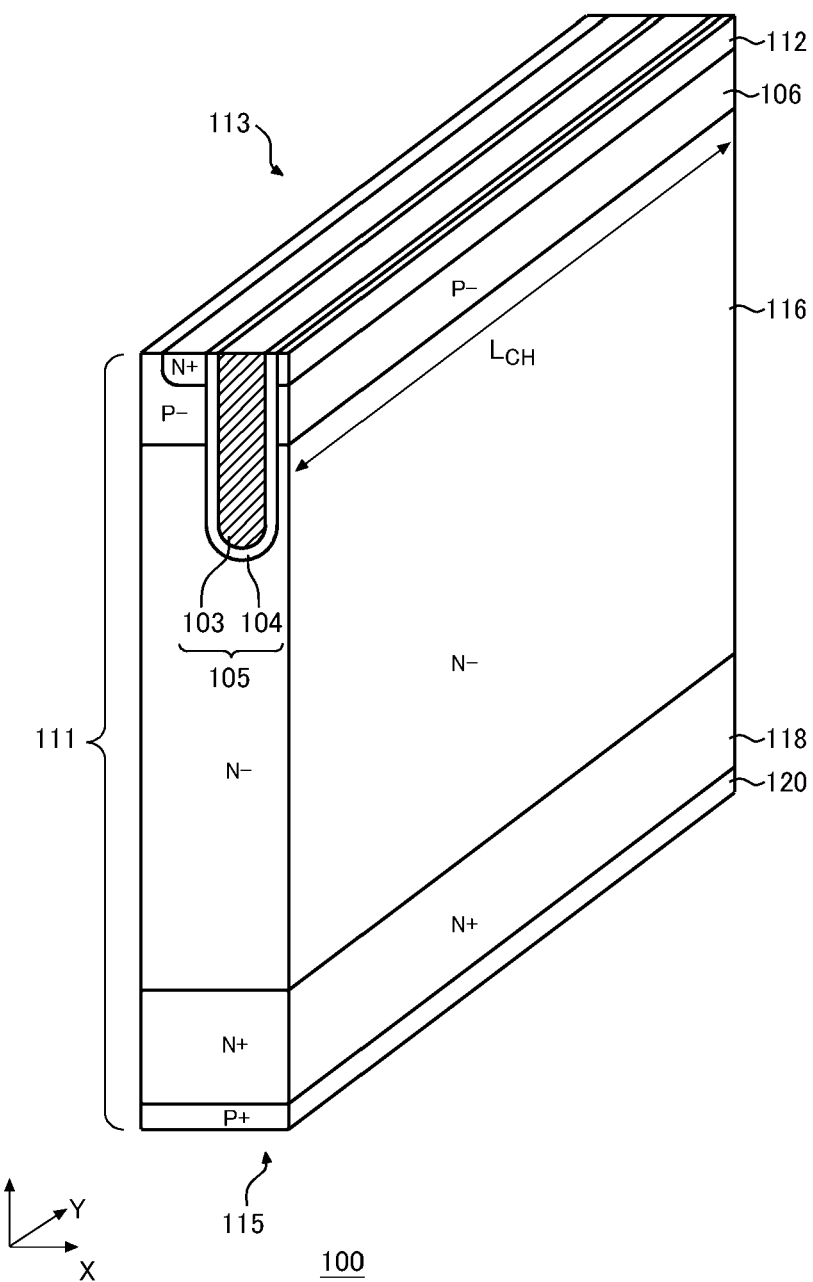
FIG. 1B is a view illustrating an example of a perspective view having an A-A cross section in FIG. 1A as a side surface.

FIG. 1B is a view illustrating an example of a perspective view having an A-A cross section in FIG. 1A as a side surface. The A-A cross section is a YZ cross section passing through the channel region 106 of the base region 114. Each member illustrated in FIG. 1A is disposed to extend in the Y axis direction. Therefore, the channel region 106 is also disposed to extend in the Y axis direction. In this example, a portion of the base region 114 disposed adjacent to the control terminal 103 with the gate dielectric film 104 interposed therebetween and sandwiched between the emitter region 112 and the drift region 116 is defined as the channel region 106. A length of the channel region 106 in the Y axis direction is defined as a channel length $L_{CH}$ (cm). In addition, the sum of the channel lengths $L_{CH}$ in the semiconductor substrate 111 is referred to as a total length β of the channel regions 106.

Figure 2:
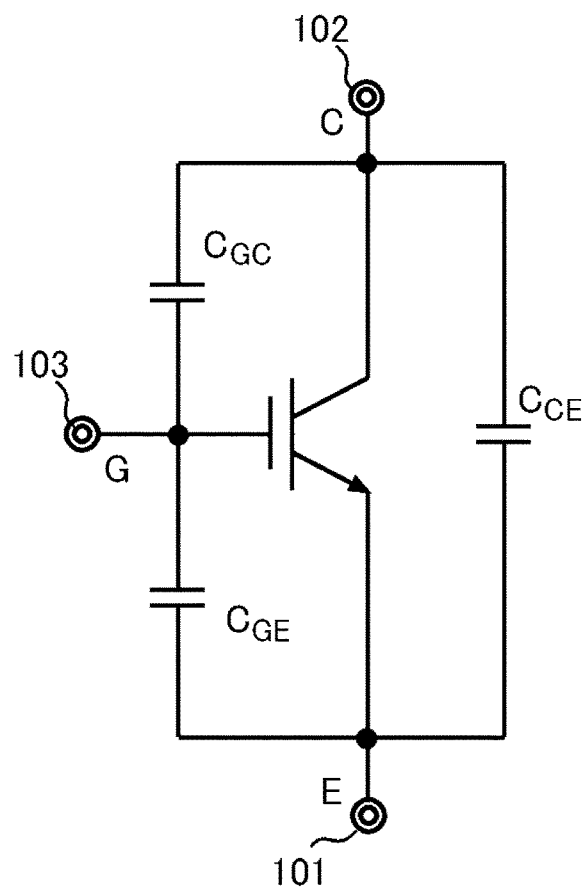
FIG. 2 is a diagram for explaining an inter-terminal capacitance of the semiconductor device 100.

FIG. 2 is a diagram for explaining the inter-terminal capacitance of the semiconductor device 100. The semiconductor device 100 has an inter-terminal capacitance $C_{CE}$ between the first main terminal 101 and the second main terminal 102, an inter-terminal capacitance $C_{GE}$ between the first main terminal 101 and the control terminal 103, and an inter-terminal capacitance $C_{GC}$ between the second main terminal 102 and the control terminal 103.

Figure 3:
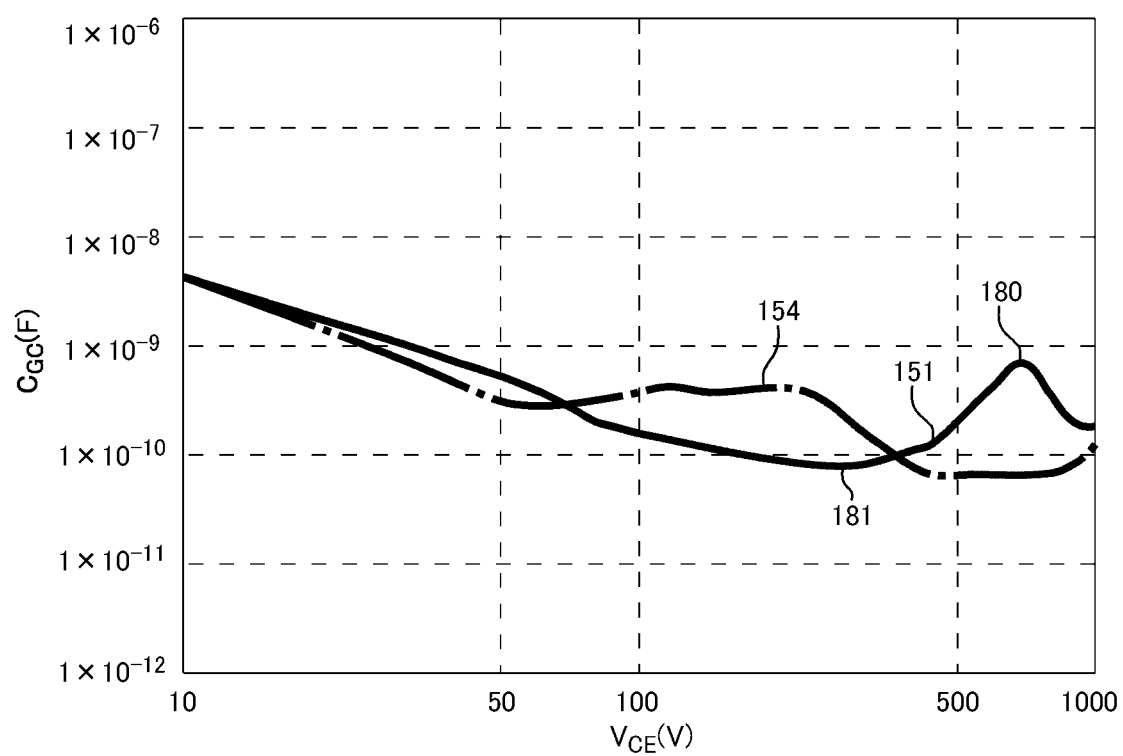
FIG. 3 is a diagram illustrating an example of a C-V characteristic of the semiconductor device 100.

FIG. 3 is a diagram illustrating an example of a C-V characteristic of the semiconductor device 100. Hereinafter, the C-V characteristic also called the C-V characteristic curve. In this example, the power supply voltage applied between the first main terminal 101 and the second main terminal 102 illustrated in FIG. 1A is defined as $V_{CE}$ (V). FIG. 3 illustrates a relationship between the power supply voltage $V_{CE}$ and the inter-terminal capacitance $C_{GC}$. A characteristic 151 is a C-V characteristic of the semiconductor device 100 according to the example illustrated in FIG. 1A, and a characteristic 154 is a C-V characteristic of the semiconductor device 100 according to the reference example. The characteristics 151 and 154 are C-V characteristics when the semiconductor device is in the on state. When the power supply voltage $V_{CE}$ changes, a range where the depletion layer 117 expands changes, and the distribution of a space charge density in the semiconductor substrate 111 changes, so that the inter-terminal capacitance $C_{CG}$ changes.

In a voltage range where the inter-terminal capacitance $C_{GC}$ rapidly decreases, vibration is likely to occur in the voltage waveform between the first main terminal 101 and the second main terminal 102. Therefore, when a peak 180 is disposed in a region where the power supply voltage $V_{CE}$ is high, it is possible to suppress the vibration of the voltage waveform in a range where the power supply voltage $V_{CE}$ is relatively low.

The characteristic 151 has a peak 180 of the inter-terminal capacitance $C_{GC}$ in a region where the power supply voltage $V_{CE}$ is 500 V or more. Note that the voltage at the local maximum of the peak 180 is defined as the voltage at which the peak 180 is disposed. As a result, it is possible to suppress the vibration of the voltage waveform when the power supply voltage $V_{CE}$ is less than 500 V. In addition, even when a surge voltage occurs in the power supply voltage $V_{CE}$, the vibration of the voltage waveform can be suppressed. The peak 180 may be disposed in a region of 550 V or higher, may be disposed in a region of 600 V or higher, or may be disposed in a region of 700 V or higher. The peak 180 may be disposed in a region of 1000 V or less, or may be disposed in a region of 800 V or less. As described later, the position of the peak 180 can be adjusted by at least one of the shape of the doping concentration distribution in the buffer region 118 and the width Wm of the mesa portion 160.

The characteristic 151 has a valley portion 181 in which the inter-terminal capacitance $C_{GC}$ exhibits a minimum value in a region where the power supply voltage $V_{CE}$ is less than 500 V. In the valley portion 181, the inter-terminal capacitance $C_{GC}$ changes more slowly than the peak 180. The width of the valley portion 181 is larger than the full width at half maximum (FWHM) of the peak 180. The width of the valley portion 181 is a difference between two power supply voltages $V_{CE}$, at which the inter-terminal capacitance $C_{GC}$ is twice the minimum value, in the power supply voltages $V_{CE}$ before and after the minimum value. The width of the valley portion 181 may be twice or more the full width at half maximum of the peak 180. The valley portion 181 may be disposed in a region where the power supply voltage $V_{CE}$ is 100 V or more, or may be disposed in a region where the power supply voltage $V_{CE}$ is 200 V or more. Note that the power supply voltage $V_{CE}$ at which the inter-terminal capacitance $C_{GC}$ exhibits a minimum value is defined as the voltage at which the valley portion 181 is disposed.

In addition, the inter-terminal capacitance $C_{GC}$ when the power supply voltage $V_{CE}$ is 500 V is larger than the minimum value of the valley portion 181. The inter-terminal capacitance $C_{GC}$ may monotonously increase from the minimum value of the valley portion 181 to the local maximum of the peak 180. With such an arrangement, it is possible to suppress a rapid decrease in the inter-terminal capacitance $C_{GC}$ in a region where the power supply voltage $V_{CE}$ is less than 500 V.

The characteristic 154 according to the reference example has a peak in a region where the power supply voltage $V_{CE}$ is 100 V to 500 V. Therefore, the inter-terminal capacitance $C_{GC}$ rapidly decreases in the region. Therefore, the voltage $V_{CE}$ easily vibrates. For example, when the semiconductor device is turned off, the power supply voltage $V_{CE}$ increases, so that the voltage waveform easily vibrates.

Figure 4:
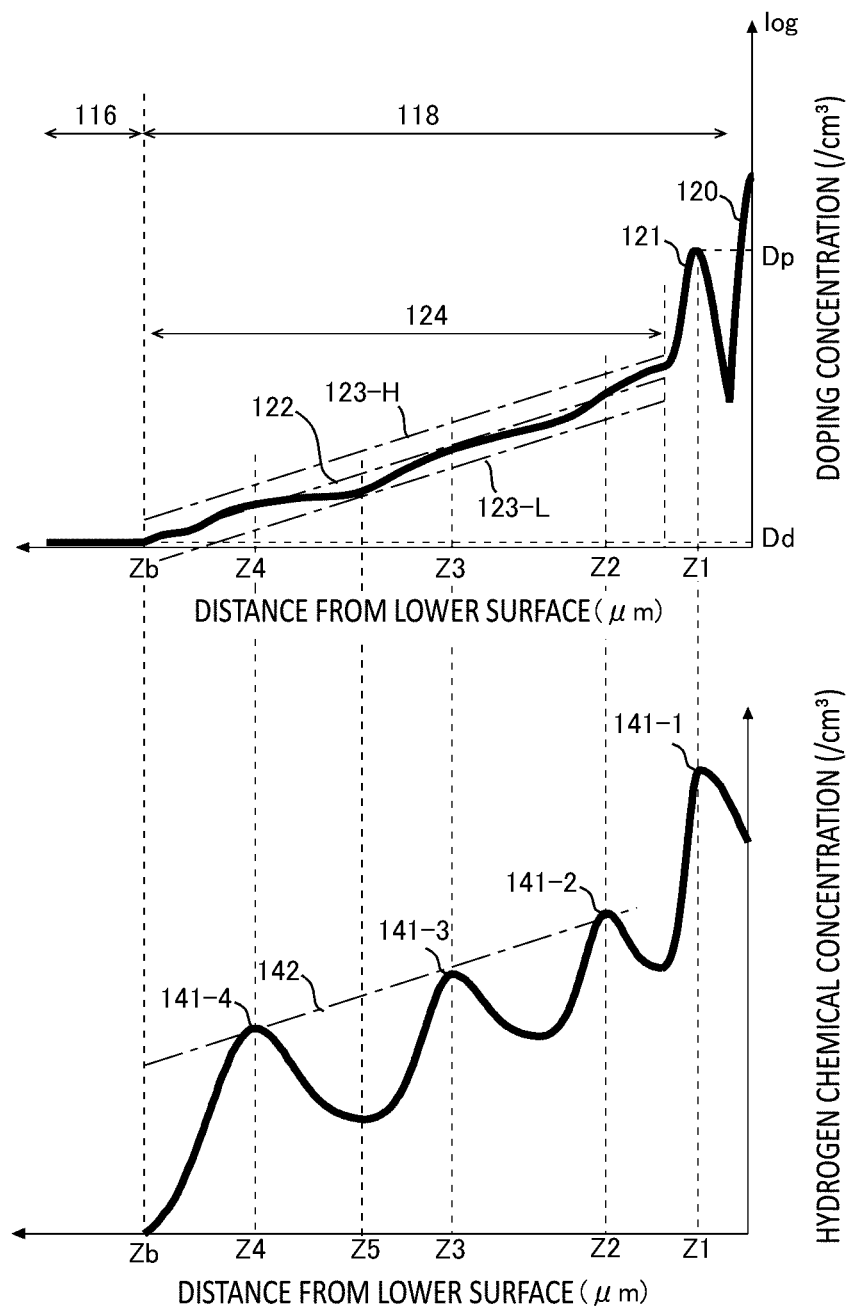
FIG. 4 is a diagram illustrating an example of a doping concentration distribution and a hydrogen chemical concentration distribution of a part of a drift region 116, the buffer region 118, and the collector region 120 in a depth direction.

FIG. 4 is a diagram illustrating an example of a doping concentration distribution and a hydrogen chemical concentration distribution of a part of the drift region 116, the buffer region 118, and the collector region 120 in the depth direction. The collector region 120 is formed by implanting a P-type dopant such as boron. The collector region 120 has a peak of doping concentration.

The buffer region 118 is formed by implanting an N-type dopant such as hydrogen. A PN junction at the boundary between the buffer region 118 and the collector region 120 is defined as the lower end of the buffer region 118.

The doping concentration of the drift region 116 is denoted by Dd. The doping concentration of the drift region 116 may be substantially constant in the depth direction. The term "substantially constant" may refer to that, in the depth range of the drift region 116, the variation range of the doping concentration is less than ±20% of the average value Dd of the doping concentration. In the semiconductor substrate 111, bulk donors may be substantially uniformly distributed throughout the substrate. The bulk donor is a donor existing from the time of forming the ingot of the semiconductor substrate. The bulk donor is, for example, phosphorus but is not limited thereto. The doping concentration of the drift region 116 may be the same as the bulk donor concentration.

The buffer region 118 of this example is in contact with the drift region 116. A boundary Zb between the drift region 116 and the buffer region 118 may be a first position where the doping concentration becomes 1.2×Dd when the doping concentration distribution is observed from the drift region 116 toward the lower surface 115.

The buffer region 118 of this example has an increase region 124 in which the doping concentration monotonously increases from the boundary Zb with the drift region 116 toward the lower surface 115. The increase region 124 may be provided over ½ or more or may be provided over ¾ or more of the buffer region 118 in the depth direction. The increase region 124 may be provided over 10 μm or more, may be provided over 20 μm or more, or may be provided over 30 μm or more.

A monotonously increasing doping concentration refers to a state where the doping concentration is continuously increased or maintained when the doping concentration distribution is observed toward the lower surface 115. That is, the increase region 124 does not have a region where the doping concentration decreases toward the lower surface 115. However, the increase region 124 may include a minute decrease in doping concentration due to measurement noise or other factors. When the doping concentration distribution is observed toward the lower surface 115, in a case where the minimum value of the doping concentration is 80% or more of the previous maximum value, it may be determined that the doping concentration does not decrease in the portion including the minimum value. In a case where the minimum value of the doping concentration is 90% or more of the previous maximum value, it may be determined that the doping concentration does not decrease in the portion including the minimum value.

Since the doping concentration of the increase region 124 monotonously increases, the increase region 124 does not include a doping concentration peak. By providing the increase region 124 where substantially no doping concentration peak exists, it is possible to suppress a rapid change in the inter-terminal capacitance $C_{GC}$ when the depletion layer 117 reaches the region.

The buffer region 118 may have one or less doping concentration peaks 121. That is, the buffer region 118 may have only one doping concentration peak 121, and the doping concentration peak 121 may not exist. The doping concentration peak 121 has an upper tail in which the doping concentration decreases from the local maximum toward the upper surface 113 and a lower tail in which the doping concentration decreases from the local maximum toward the lower surface 115. The doping concentration peak 121 of this example has a local maximum at a depth position Z1. The doping concentrations at the upper tail and the lower tail may be reduced to at least half or less, or may be reduced to 0.1 times or less with respect to the doping concentration Dp at the local maximum.

The increase region 124 does not include the doping concentration peak 121. When the gradient of the doping concentration distribution toward the lower surface 115 is observed, a position where the gradient starts to increase toward the local maximum of the depth position Z1 may be defined as the lower end position of the increase region 124. A position where the second-order derivative of the doping concentration in the depth direction becomes the maximum value may be defined as the lower end position of the increase region 124. In another example, a depth position 5

µm away from the depth position Z1 may be defined as the end position of the doping concentration peak 121. As illustrated in FIG. 4, when the doping concentration peak 121 is disposed on the lower side of the increase region 124, a position 5 µm away from the depth position Z1 toward the upper surface 113 may be defined as the lower end position of the increase region 124. As described later, when a plurality of hydrogen concentration peaks 141 are included in the buffer region 118, a depth position Z2 of a hydrogen concentration peak 141-2 disposed second closest to the lower surface 115 may be defined as the lower end position of the increase region 124.

In the present specification, the gradient of the doping concentration in the increase region 124 is denoted by α. The gradient α is a rate at which the value logD of the common logarithm of the doping concentration D increases per 1 cm in the depth direction, and the unit is ($cm^{-1}$). The gradient α may be a gradient of an approximate straight line 122 obtained by approximating the doping concentration distribution of the increase region 124 by a least squares method.

In the semiconductor device 100, the gradient α and the total length β of the channel regions 106 described above satisfy the following Expression (1). $β>2\times10^3/α$ . . . Expression (1) According to Expression (1), the lower limit of the gradient α is determined according to the reciprocal 1/β of the total length β. When the total length β of the channel regions 106 is small, the channel regions 106 on the upper surface 113 of the semiconductor substrate 111 are reduced, and the carriers injected into the semiconductor substrate 111 are reduced. In this case, the lower limit of the gradient α becomes large. When the gradient α increases, the increase region 124 is shortened in the depth direction. On the other hand, according to Expression (1), the upper limit of the gradient α is determined according to the reciprocal 1/β of the total length β. When the total length β of the channel regions 106 is large, the channel regions 106 on the upper surface 113 of the semiconductor substrate 111 increase, and the carriers injected into the semiconductor substrate 111 increase. In this case, the lower limit of the gradient α becomes small. When the gradient α decreases, the increase region 124 may be lengthened in the depth direction. As an example, the increase region 124 may be 30% or more, may be 40% or more, or may be 50% or more of the length from the bottom surface of the trench portion to the end surface of the collector region 120 on the buffer region 118 side. A case where the total length β is large is, for example, a case where the area of the active region of the semiconductor device 100 is large. That is, Expression (1) shows that when the active region is large or the total length β is large, the gradient α is made relatively small, so that a rapid change in the inter-terminal capacitance $C_{GC}$ can be suppressed.

A straight line obtained by multiplying the doping concentration of the approximate straight line 122 by two is defined as a straight line 123-H, and a straight line obtained by multiplying the doping concentration by ½ is defined as a straight line 123-L. The doping concentration in the increase region 124 may be a value between the straight line 123-H and the straight line 123-L in the entire increase region 124. As a result, a rapid increase/decrease in the doping concentration is eliminated, and thus a rapid change in the inter-terminal capacitance $C_{GC}$ in the C-V characteristic can be suppressed.

The hydrogen chemical concentration distribution of the buffer region 118 in the depth direction may have more hydrogen concentration peaks 141 than the doping concentration peaks 121. A plurality of hydrogen concentration peaks 141 can be formed by implanting hydrogen ions into a plurality of depth positions from the lower surface 115. By annealing the semiconductor substrate 111 after implanting hydrogen ions, a VOH defect which is a combination of a vacancy defect (V), oxygen (O), and hydrogen (H) is formed. The VOH defect functions as a donor. Therefore, the doping concentration distribution as illustrated in FIG. 4 can be formed by implanting hydrogen ions into a plurality of depth positions while reducing a dosage according to the depth distance from the lower surface 115.

The buffer region 118 of this example has hydrogen concentration peaks 141-1, 141-2, 141-3, and 141-4 at depth positions Z1, Z2, Z3, and Z4. The hydrogen concentration peak 141-1 disposed closest to the lower surface 115 is disposed at the same depth as the doping concentration peak 121. Disposing two peaks at the same depth means that the local maximum of one peak is disposed in a range of the full width at half maximum of the other peak.

The hydrogen concentration peak 141-1 has a higher hydrogen chemical concentration than other hydrogen concentration peaks 141. The concentration of the peak refers to the concentration of the local maximum of the peak. The hydrogen concentration peak 141-1 may have a concentration of five times or more, may have a concentration of ten times or more, or may have a concentration of 100 times or more the maximum concentration of the hydrogen chemical concentrations of other hydrogen concentration peaks 141. By lowering the hydrogen concentrations of the hydrogen concentration peaks 141-2, 141-3, and 141-4, the increase region 124 can be formed without providing a peak in the doping concentration distribution. A depth range from the local maximum of the hydrogen concentration peak 141-4 formed at the deepest position to the local maximum of the hydrogen concentration peak 141-2 formed at the second shallowest position may be defined as the increase region 124.

The concentration of each hydrogen concentration peak 141 decreases as a distance from the lower surface 115 increases. A straight line obtained by approximating the local maximums of the hydrogen concentration peaks 141-2, 141-3, and 141-1 other than the hydrogen concentration peak 141-4 by the least squares method is defined as a straight line 142. The gradient of the straight line 142 is substantially equal to the gradient α of the approximate straight line 122. The gradient of the straight line 142 may be 0.5 times or more and two times or less the gradient α.

In addition, in the increase region 124, the doping concentration distribution is flatter than the hydrogen chemical concentration distribution. In the hydrogen chemical concentration distribution, the depth position of the minimum value between the hydrogen concentration peak 141-4 farthest from the lower surface 115 and the hydrogen concentration peak 141-3 second farthest from the lower surface 115 is defined as Z5. A difference in doping concentration between the depth positions Z4 and Z5 is smaller than a difference in hydrogen chemical concentration between the depth positions Z4 and Z5. The difference in doping concentration may be 0.5 times or less, may be 0.1 times or less, or may be 0.05 times or less the difference in hydrogen chemical concentration.

Figure 5:
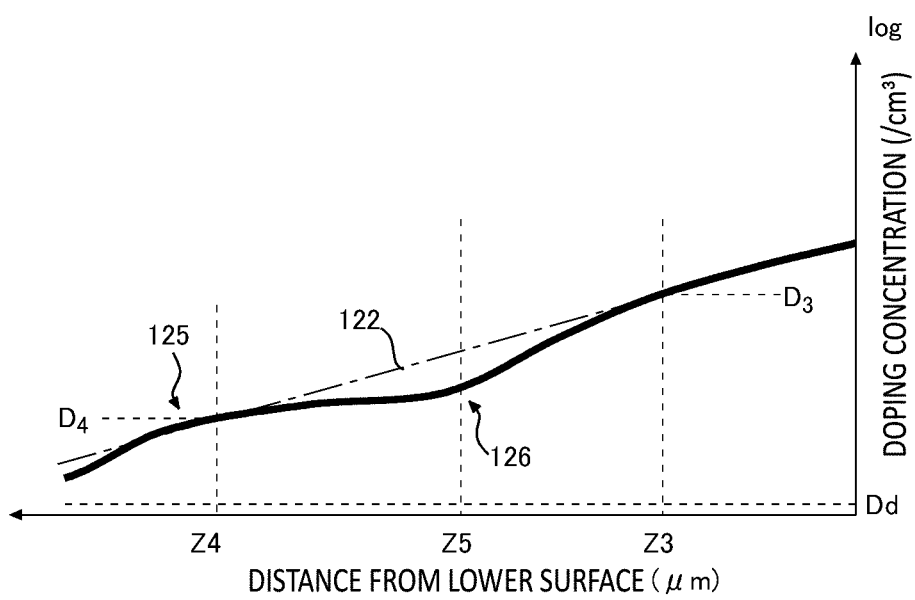
FIG. 5 is a diagram for explaining a gradient α of the doping concentration distribution.

FIG. 5 is a diagram for explaining the gradient α of the doping concentration distribution. The doping concentration at the depth position Z4 is denoted by $D_4$, and the doping concentration at the depth position Z3 is denoted by $D_3$. The gradient α (/cm) is given by Expression (2). $α=|log(D_3)-log(D_4)|/|Z3-Z4|$ . . . Expression (2)

In addition, the doping concentration distribution in the increase region 124 may have a convex portion 125 protruding upward and a concave portion 126 protruding downward. The convex portion 125 is disposed in a range including the depth position Z4. The concave portion 126 is disposed at a position including the depth position Z5.

The doping concentration distribution in the increase region 124 may be the convex portion 125 entirely protruding upward. The doping concentration distribution in the increase region 124 may be the concave portion 126 entirely protruding downward. The doping concentration distribution in the increase region 124 may have a linear shape.

Figure 6:
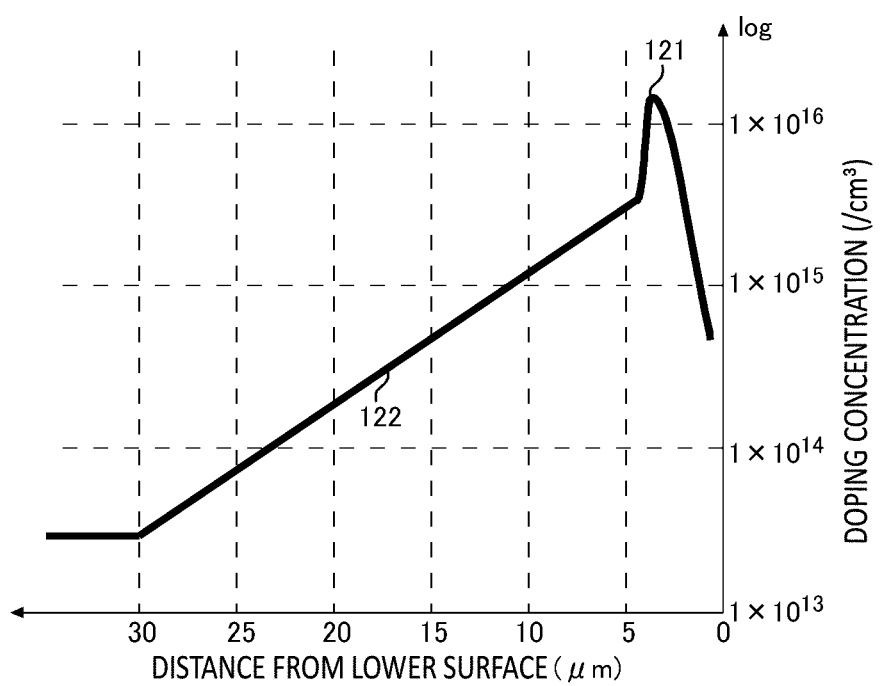
FIG. 6 is a diagram illustrating a numerical example of an approximate straight line 122.

FIG. 6 is a diagram illustrating a numerical example of the approximate straight line 122. In this example, the depth position of both ends of the approximate straight line is denoted by X1 and X2, and the doping concentrations at the depth positions X1 and X2 are denoted by N1 and N2. X1=4.3 μm=4.3×10$^{-4}$ cm, N1=3.5×10$^{15}$/cm$^3$, log(N1)= 15.55, X2=29.9 μm=29.9×10$^{-4}$ cm, N2=2.9×10$^{13}$/cm$^3$, and log(N2)=13.46.

From Expression (2), the gradient α is expressed by the following expression. α=|15.55−13.46|/|4.3×10$^{-4}$−29.9× 10$^{-4}$|≈816.5

In this case, the right side of Expression (1) is 2.45 cm. Therefore, the total length β of the channel region 106 is preferably larger than 2.45 cm.

Figure 7:
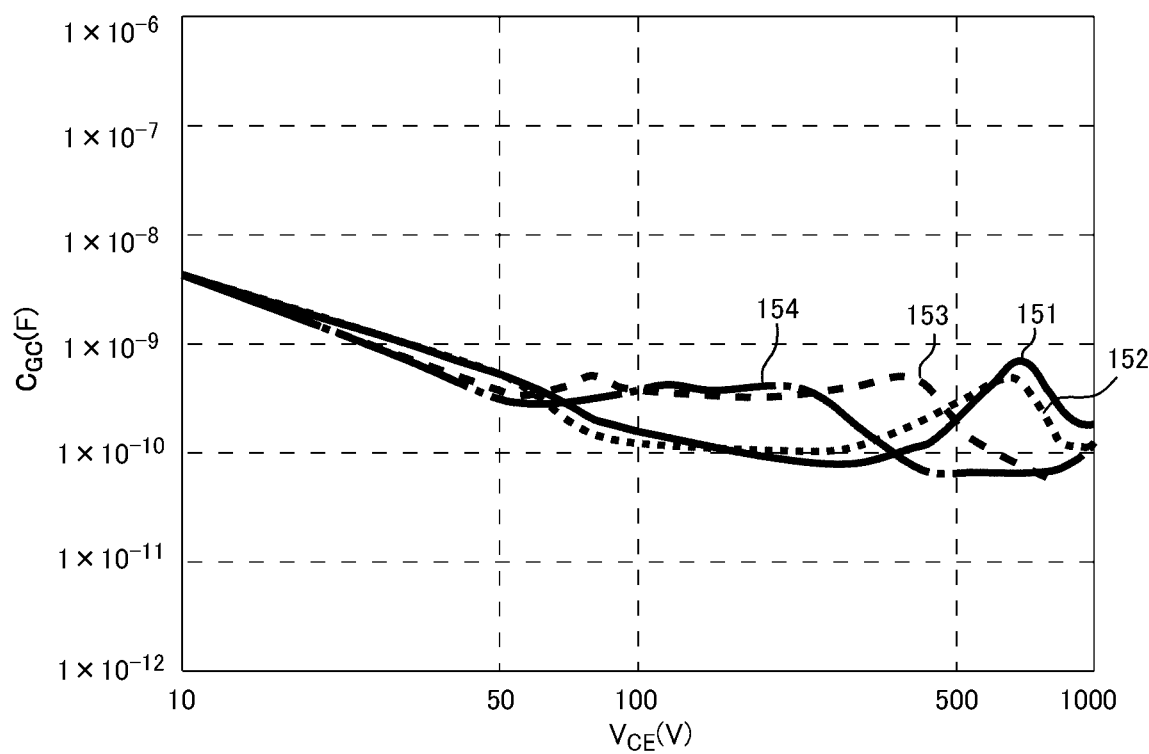
FIG. 7 is a diagram illustrating an example of the C-V characteristic.

FIG. 7 is a diagram illustrating an example of the C-V characteristic. In this example, an example in which the doping concentration distribution of the buffer region 118 has two or more doping concentration peaks is referred to as "with peaks", and an example in which the doping concentration distribution has one or less doping concentration peaks as in the example of FIG. 4 is referred to as "no peak". In addition, an example in which a width Wm of the mesa portion 160 is 20% or less of a depth Zt of the gate structure portion 105 is referred to as a "narrow mesa", and an example in which the width Wm is larger than 20% of the depth Zt is referred to as a "wide mesa".

The characteristic 152 is a characteristic of an example of "no peak" and "narrow mesa". In addition, the characteristic 151 is a characteristic of an example of "no peak" and "wide mesa". In addition, the characteristic 153 is a characteristic of an example of "with peaks" and "narrow mesa". In addition, the characteristic 154 is a characteristic of an example of "with peaks" and "wide mesa". In this example, Zt is 5.5 μm, the width Wm of "narrow mesa" is 1.1 μm, and the width Wm of "wide mesa" is 2.5 μm.

As illustrated in FIG. 7, in both of the characteristics 151 and 152 of the example of "no peak", the peak of the inter-terminal capacitance $C_{GC}$ is disposed in the region of 500 V or more. Therefore, the vibration of the voltage $V_{CE}$ can be suppressed.

In addition, "narrow mesa" allows the inter-terminal capacitance $C_{GC}$ to be further shifted to a high voltage side. The width Wm of the mesa portion 160 may be 1.1 μm or less. By reducing the mesa width Wm, the effect of promoting carrier injection (IE effect) increases, and the amount of carrier injected from the upper surface 113 of the semiconductor substrate 111 increases. It is experimentally confirmed that the inter-terminal capacitance $C_{GC}$ does not decrease rapidly when the carrier density on the upper surface 113 side of the semiconductor substrate 111 increases.

On the other hand, in both of the characteristics 153 and 154 of the example of "with peaks", the peak of the inter-terminal capacitance $C_{GC}$ is disposed in the region of less than 500 V. Therefore, the vibration of the voltage $V_{CE}$ is likely to occur.

Figure 8:
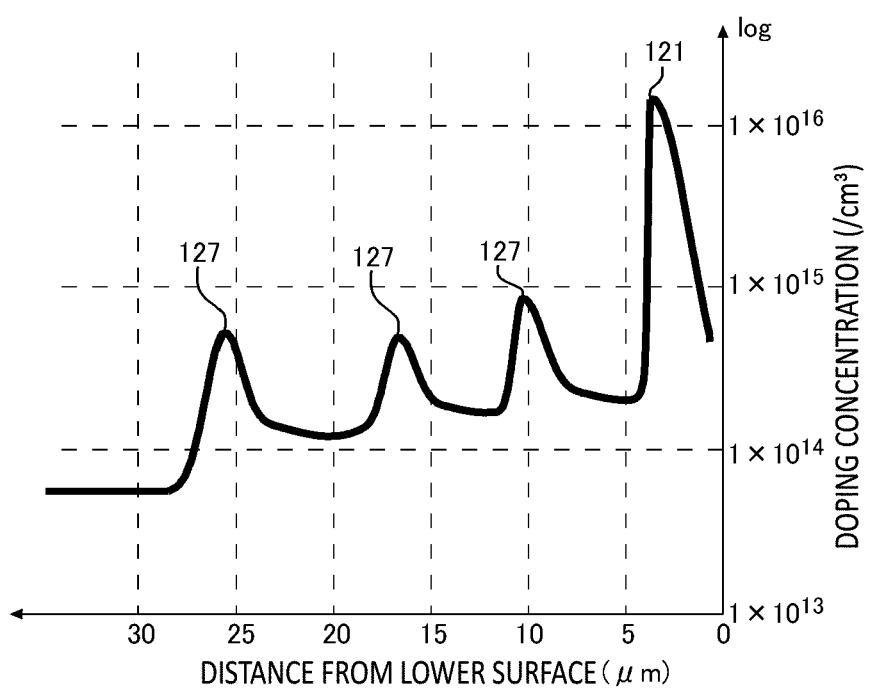
FIG. 8 is a diagram illustrating an example of the doping concentration distribution of the buffer region 118 of "with peaks".

FIG. 8 is a diagram illustrating an example of the doping concentration distribution of the buffer region 118 of "with peaks". The buffer region 118 of this example has a plurality of doping concentration peaks 127 on the upper surface 113 side of the doping concentration peak 121. In this example, the doping concentration peak 127 is disposed at a position relatively close to the upper surface 113. When the depletion layer 117 reaches the doping concentration peak 127, the inter-terminal capacitance $C_{GC}$ tends to decrease rapidly. Therefore, as illustrated in FIG. 7, the peak of the inter-terminal capacitance $C_{GC}$ appears in a region where the power supply voltage $V_{CE}$ is relatively low.

It is preferable that the C-V characteristics as illustrated in FIGS. 3 and 7 can be analyzed with high accuracy. The C-V characteristic may be a characteristic acquired by an analysis device 10 described later.

Figure 9:
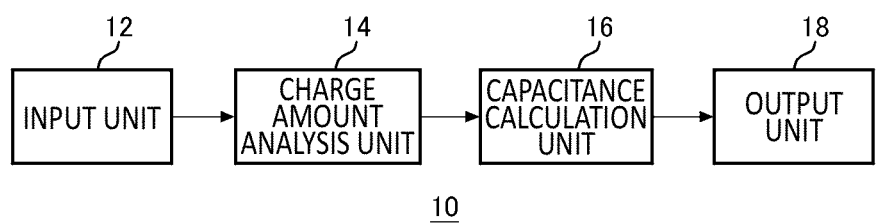
FIG. 9 is a diagram illustrating an example of an analysis device 10 according to one embodiment of the present invention.

FIG. 9 is a diagram illustrating an example of the analysis device 10. The analysis device 10 analyzes the characteristics of the semiconductor device 100 described with reference to FIGS. 1A to 8. The analysis device 10 analyzes any terminal capacitance of the semiconductor devices 100. The terminal capacitance may be a parasitic capacitance of any terminal. The terminal capacitance may be a parasitic capacitance between any two terminals.

The analysis device 10 may be a device implemented by a computer. A program for causing the computer to function as the analysis device 10 may be given to the computer. The computer executes the program to execute an analysis method by the analysis device 10.

The analysis device 10 includes an input unit 12, a charge amount analysis unit 14, a capacitance calculation unit 16, and an output unit 18. Data related to the semiconductor device 100 to be analyzed is input to the input unit 12. The data may be input by a user or the like of the analysis device 10. The data may include information such as a position, a size, a shape, an impurity concentration, an electric resistance, and a capacitance of each portion of the semiconductor device 100.

The charge amount analysis unit 14 analyzes a charge amount in a predetermined region in the semiconductor device 100 under a predetermined analysis condition. The predetermined analysis condition may include a condition for specifying a control voltage to be applied to the control terminal and a power supply voltage to be applied between the first main terminal 101 and the second main terminal 102. The charge amount analysis unit 14 analyzes the charge amount of the semiconductor device 100 by a device simulator capable of simulating a transient change in the charge amount in the semiconductor device 100. The transient change is, for example, a temporal change of the charge amount in the semiconductor device 100. The device simulator analyzes the temporal change of the charge amount in the semiconductor device 100 when the power supply voltage is changed, for example. The device simulator may analyze a charge density in a predetermined region in the semiconductor device 100 by using, for example, Poisson's equation, and calculate the charge amount in the region by integrating the charge density. The charge amount analysis unit 14 may analyze the charge amount in the semiconductor device 100 by using a known simulator.

The charge amount analysis unit 14 sets the semiconductor device 100 to the on state by setting the control voltage applied to the control terminal 103 to a predetermined value, and sets the power supply voltage applied between the first main terminal 101 and the second main terminal 102 to a predetermined initial voltage. Then, the charge amount analysis unit 14 analyzes, by the device simulator, a change in the charge amount at any terminal when the power supply voltage $V_{CE}$ is changed by a displacement voltage smaller than the initial voltage.

The capacitance calculation unit 16 calculates any terminal capacitance on the basis of the change in the charge amount analyzed by the charge amount analysis unit 14. The capacitance calculation unit 16 may calculate the terminal capacitance on the basis of the change in the charge amount with respect to the displacement voltage. Since a capacitance C is a value (C=Q/V) obtained by dividing a charge amount Q by the voltage V, the terminal capacitance can be calculated by dividing the amount of change in charge by the displacement voltage.

The output unit 18 outputs information regarding the terminal capacitance calculated by the capacitance calculation unit 16. The output unit 18 may display the information regarding the terminal capacitance on a display device, may transmit the information to an external device, or may store the information in a storage medium.

Figure 10:
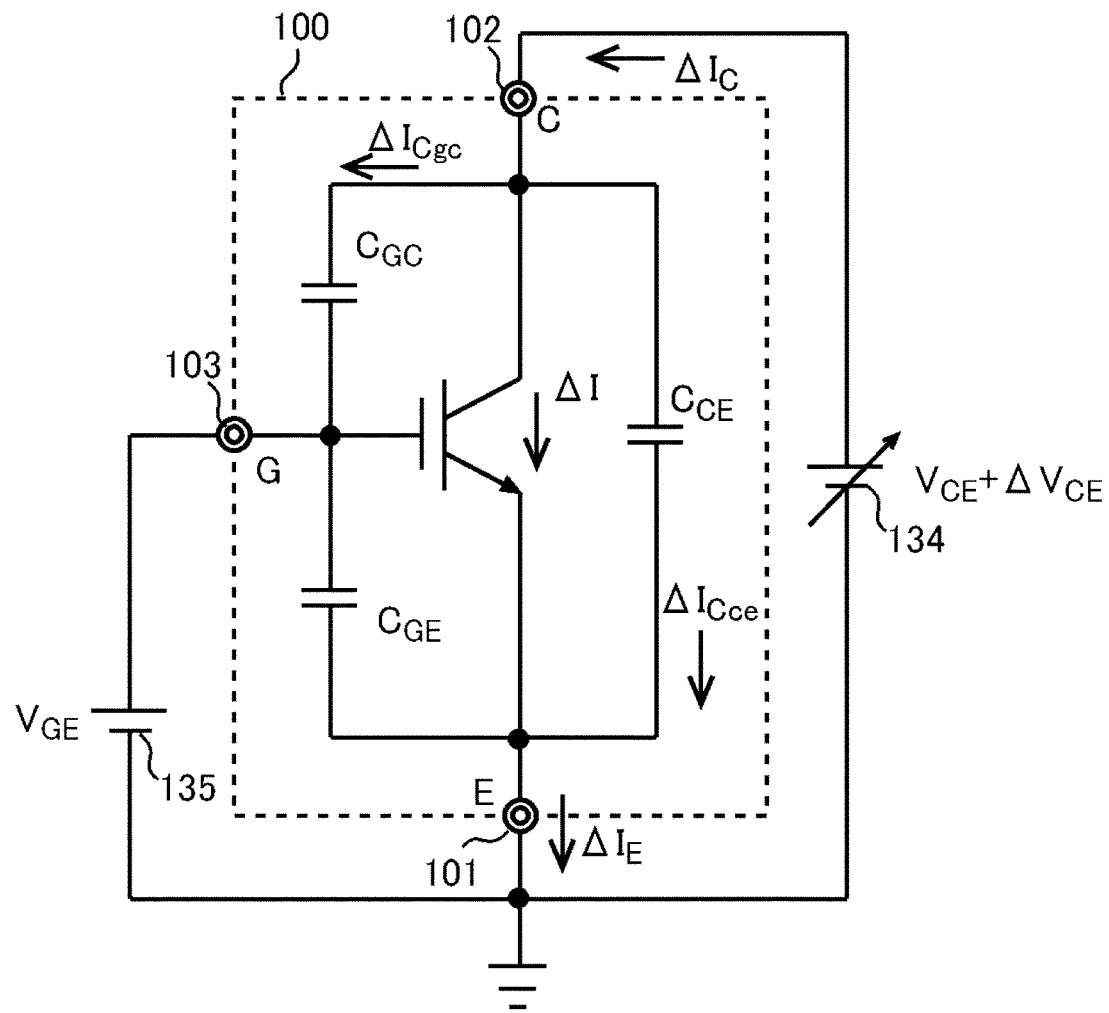
FIG. 10 is an example of a circuit 300 schematically illustrating the semiconductor device 100.

FIG. 10 is an example of a circuit 300 schematically illustrating the semiconductor device 100. The analysis device 10 may analyze the operation of the semiconductor device 100 by using the circuit 300. A control voltage $V_{GE}$ is applied from a power supply 135 to the control terminal 103. The first main terminal 101 is connected to a reference potential such as a ground potential. The power supply voltage $V_{CE}$ is applied from the power supply 134 between the first main terminal 101 and the second main terminal 102. The charge amount analysis unit 14 may set the control voltage $V_{GE}$ and the power supply voltage $V_{CE}$ and analyze the charge amount in the semiconductor device 100.

A capacitance between the first main terminal 101 and the second main terminal 102 of the semiconductor device 100 is defined as the inter-terminal capacitance $C_{CE}$. Similarly, a capacitance between the first main terminal 101 and the control terminal 103 is referred to as the inter-terminal capacitance $C_{GE}$, and a capacitance between the second main terminal 102 and the control terminal 103 is referred to as the inter-terminal capacitance $C_{GC}$. The capacitance calculation unit 16 calculates any inter-terminal capacitance. In the inter-terminal capacitance $C_{GC}$ of the semiconductor device 100, a value in the on state and a value in the off state of the semiconductor device 100 may be different. In a case where the semiconductor device 100 is in the on state, when a current density is large, it is difficult to accurately measure or calculate the inter-terminal capacitance $C_{GC}$. In the following example, an example in which the inter-terminal capacitance $C_{GC}$ is accurately calculated even when the semiconductor device 100 is in the on state will be described.

Figure 11:
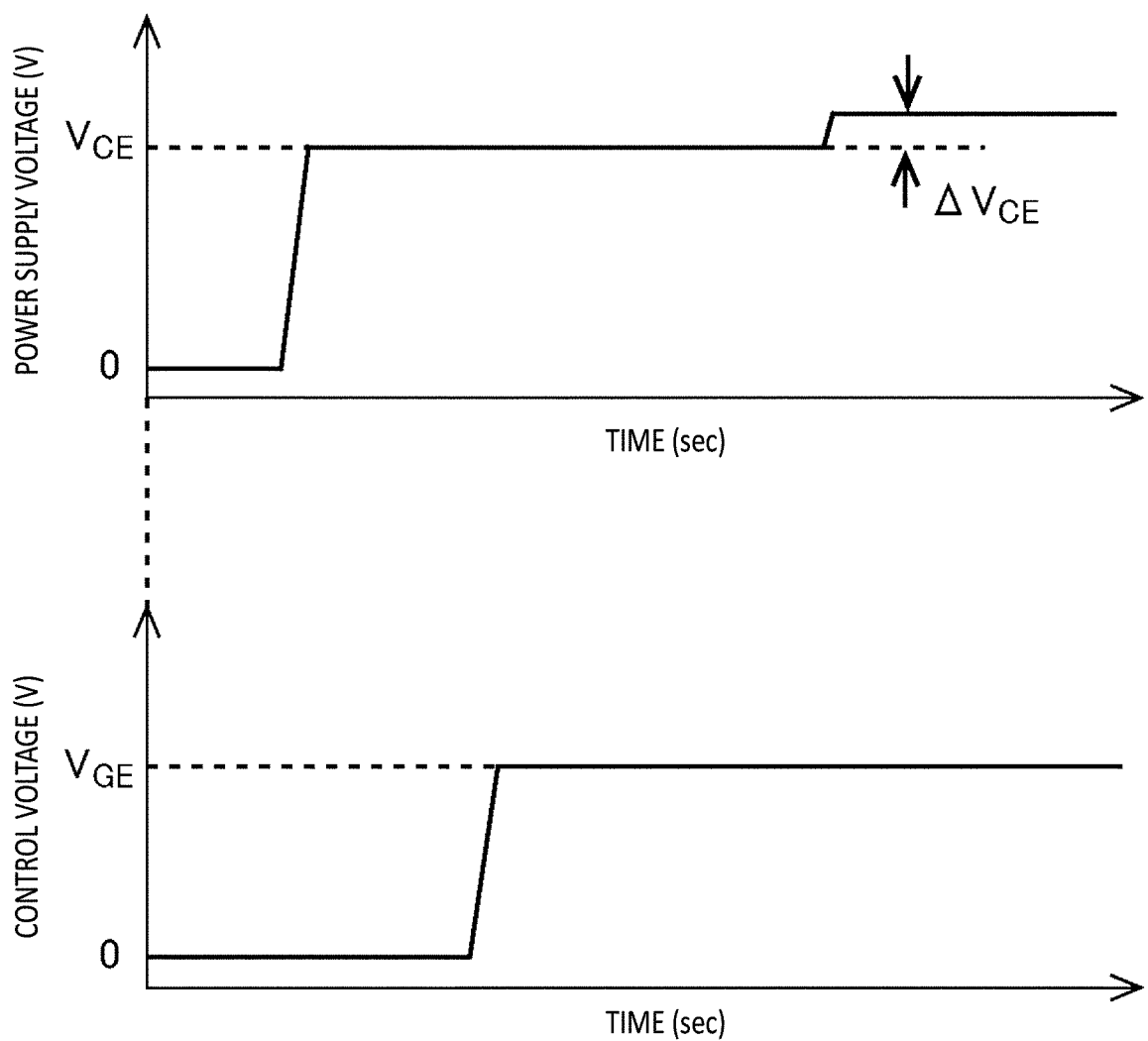
FIG. 11 is a diagram for explaining an operation example of a charge amount analysis unit 14.

FIG. 11 is a diagram illustrating an operation example of the charge amount analysis unit 14. The charge amount analysis unit 14 sets the control voltage $V_{GE}$ to turn on the semiconductor device 100. That is, the charge amount analysis unit 14 sets the control voltage $V_{GE}$ higher than a threshold voltage of the semiconductor device 100. In addition, the charge amount analysis unit 14 sets the power supply voltage $V_{CE}$ to a predetermined initial value. Then, the charge amount analysis unit 14 calculates a change in the charge amount of the first main terminal 101 when the power supply voltage $V_{CE}$ is changed by a displacement voltage $\Delta V_{CE}$ after a current ICE between the collector electrode C and the emitter electrode E becomes constant. The displacement voltage $\Delta V_{CE}$ is sufficiently smaller than the power supply voltage $V_{CE}$. For example, the displacement voltage $\Delta V_{CE}$ may be 10% or less, may be 1% or less, or may be 0.1% or less of the power supply voltage $V_{CE}$. The state where the current ICE between the collector electrode C and the emitter electrode E is constant may be, for example, a state where the current ICE between the collector electrode C and the emitter electrode E does not substantially change with time at a constant current value, and may be a state where the current flowing through the control terminal 103 is substantially zero. The term "not substantially change" may refer to that, for example, a variation range is 20% or less of the average value. Since the control voltage $V_{GE}$ does not change, the inter-terminal capacitance $C_{GE}$ does not change. Therefore, the displacement current caused by the minute change $\Delta V_{CE}$ in the power supply voltage $V_{CE}$ is caused only by the inter-terminal capacitance $C_{GC}$. The inter-terminal capacitance $C_{GC}$ may be calculated, for example, by calculating an amount of change $\Delta Q_{GC}$ in charge between the electrodes GC from a space charge density between a gate oxide film and a drift region and dividing the result by the amount of change $\Delta V_{CE}$ in voltage between the electrodes CE ($\Delta Q_{GC}/\Delta V_{CE}$).

The charge amount analysis unit 14 may set the magnitude of the displacement voltage $\Delta V_{CE}$ according to a change in the magnitude of the power supply voltage $V_{CE}$. For example, the displacement voltage $\Delta V_{CE}$ may be a voltage obtained by multiplying the power supply voltage $V_{CE}$ by a predetermined coefficient. In another example, the displacement voltage $\Delta V_{CE}$ may be a constant voltage regardless of a change in the power supply voltage $V_{CE}$.

The charge amount of the terminal may be a charge amount of a contact region in contact with the terminal in the semiconductor substrate 111. For example, the charge amount of the second main terminal 102 includes the collector region 120 in contact with the second main terminal 102. In addition, the charge amount of the first main terminal 101 includes the charge amount of the emitter region 112 and the base region 114 in contact with the first main terminal 101.

The charge amount analysis unit 14 may calculate the charge amount of the collector region 120 by using Poisson's equation expressed by the following expression.

$$\nabla^2 \cdot \phi = -q(p-n+N_D-N_A)/\varepsilon$$

where $\nabla$ is a differential operator, $\phi$ is an electrostatic potential, q is an elementary charge, p is a hole density, n is an electron density, $N_D$ is a donor concentration, $N_A$ is an acceptor concentration, and $\varepsilon$ is a dielectric constant of the semiconductor substrate 111. The dielectric constant $\varepsilon$ of the semiconductor substrate 111 is a value obtained by multiplying a vacuum dielectric constant $\varepsilon_0$) by a relative dielectric constant $\varepsilon_r$ of the semiconductor substrate 111. The term of $p-n+N_D-N_A$ corresponds to the charge density.

The dielectric constant E may be given as an analysis condition to the charge amount analysis unit 14. In addition, the electrostatic potential $\phi$ at each position of the semiconductor region is determined by the power supply voltage $V_{CE}$. For each position, the charge amount analysis unit 14 calculates a charge density when the power supply voltage is $V_{CE}$ and a charge density when the power supply voltage is $V_{CE}+\Delta V_{CE}$ by the above-described Poisson's equation. In the charge amount analysis unit 14, the donor concentration $N_D$ and the acceptor concentration $N_A$ at each position of the semiconductor substrate 111 may be set in advance as analysis conditions.

The charge amount analysis unit 14 calculates the sum of the charge densities of the collector regions 120. The charge amount analysis unit 14 may integrate the above-described charge density. The charge amount can be calculated by multiplying the integrated value of the charge density by the elementary charge. The charge amount analysis unit 14 may calculate the temporal change of the charge amount when the power supply voltage is changed as illustrated in FIG. 11 by transient analysis (forming a differential equation on the basis of Kirchhoff's law and deriving a solution). The charge amount analysis unit 14 may calculate, as the charge amount when the power supply voltage is $V_{CE}+\Delta V_{CE}$, the charge amount when the change in the charge amount converges. The charge amount analysis unit 14 may calculate a difference $\Delta Q$ between the charge amount when the power supply voltage is $V_{CE}$ and the charge amount when the power supply voltage is $V_{CE}+\Delta V_{CE}$.

The charge amount analysis unit 14 may further calculate the charge density in at least a part of the drift region 116. Similarly to the collector region 120, the charge density of the drift region 116 can also be analyzed from the power supply voltage $V_{CE}$ and the displacement voltage $\Delta V_{CE}$ by using Poisson's equation. For example, the charge amount analysis unit 14 may calculate the charge density of the drift region 116 in a range where the depletion layer 117 expands when the power supply voltage $V_{CE}$ is applied. The charge amount analysis unit 14 may calculate the charge amount of the region by integrating the charge density of the region of the drift region 116. The charge amount analysis unit 14 may include the charge amount of the region in the charge amount of the second main terminal 102. Since the inter-terminal capacitance $C_{GC}$ can change depending on how the depletion layer 117 expands, the inter-terminal capacitance $C_{GC}$ can be analyzed more accurately by considering the charge amount in the region.

The capacitance calculation unit 16 calculates the inter-terminal capacitance $C_{GC}$ on the basis of the charge amount difference $\Delta Q$, which is calculated by the charge amount analysis unit 14, and the displacement voltage $\Delta V_{CE}$. The capacitance calculation unit 16 may calculate the inter-terminal capacitance $C_{GC}$ by the following expression.

$C_{GC} = \Delta Q / \Delta V_{CE}$

Figure 12:
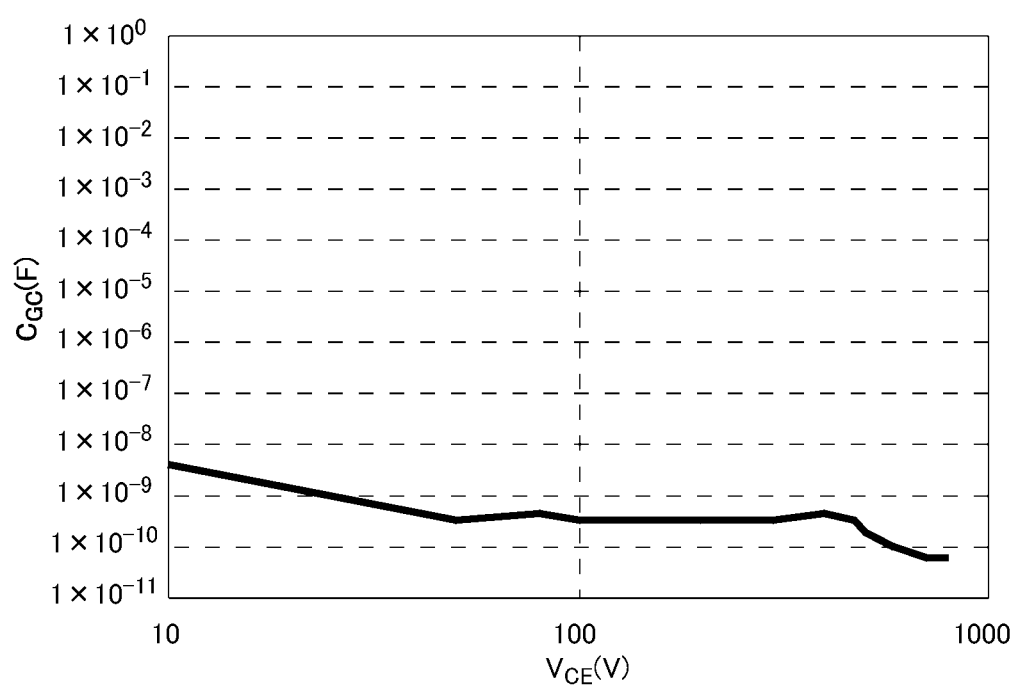
FIG. 12 is a diagram illustrating an example of the C-V characteristic calculated by a capacitance calculation unit 16.

FIG. 12 is a diagram illustrating an example of the C-V characteristic calculated by the capacitance calculation unit 16. In this example, the charge amount analysis unit 14 changes the power supply voltage $V_{CE}$ from the initial voltage, and analyzes the change $\Delta Q$ in the charge amount when the power supply voltage $V_{CE}$ is changed by the displacement voltage $\Delta V_{CE}$ for each of the changed power supply voltages $V_{CE}$. For example, the charge amount analysis unit 14 changes the power supply voltage $V_{CE}$ to be 10 V, 50 V, 100 V, 500 V, and so on, and calculates the change $\Delta Q$ in the charge amount when the power supply voltage $V_{CE}$ is changed by the displacement voltage $\Delta V_{CE}$ with respect to each power supply voltage $V_{CE}$.

The capacitance calculation unit 16 calculates the inter-terminal capacitance $C_{GC}$ for each power supply voltage $V_{CE}$ on the basis of the change $\Delta Q$ in the charge amount analyzed for each power supply voltage $V_{CE}$. As a result, a C-V characteristic as illustrated in FIG. 12 is obtained. The capacitance calculation unit 16 may use the calculated inter-terminal capacitance $C_{GC}$ as a capacitance value at the power supply voltage $V_{CE}$. That is, the calculated inter-terminal capacitance $C_{GC}$ may be used as the capacitance value at the power supply voltage $V_{CE}$ before the change. In another example, the capacitance calculation unit 16 may use the calculated inter-terminal capacitance $C_{GC}$ as a capacitance value with respect to the power supply voltage $V_{CE}+\Delta V_{CE}$. That is, the calculated inter-terminal capacitance $C_{GC}$ may be used as the capacitance value with respect to the power supply voltage $V_{CE}+\Delta V_{CE}$ after the power supply voltage $V_{CE}$ is changed by the displacement voltage $\Delta V_{CE}$. The capacitance calculation unit 16 may use the calculated inter-terminal capacitance $C_{GC}$ as a capacitance value with respect to the power supply voltage $V_{CE}+0.5\times \Delta V_{CE}$. That is, the calculated inter-terminal capacitance $C_{GC}$ may be used as the capacitance value with respect to the average power supply voltage before and after the change.

Figure 13:
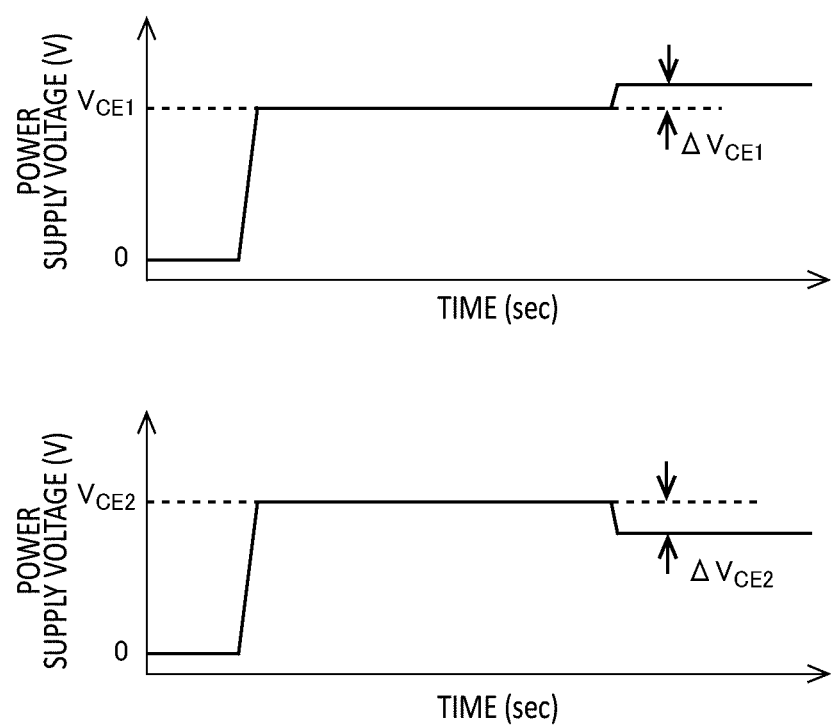
FIG. 13 is a diagram illustrating another operation example of the charge amount analysis unit 14.

FIG. 13 is a diagram illustrating another operation example of the charge amount analysis unit 14. The charge amount analysis unit 14 of this example analyzes a first change $\Delta Q1$ in the charge amount when the first displacement voltage $\Delta V_{CE1}$ is added to the first power supply voltage $V_{CE1}$ and a second change $\Delta Q2$ in the charge amount when the second displacement voltage $\Delta V_{CE2}$ is subtracted from the second power supply voltage $V_{CE2}$.

The first power supply voltage $V_{CE1}$ and the second power supply voltage $V_{CE2}$ may be the same voltage. That is, the voltages may be set such that the power supply voltages before the change become the same. The charge amount analysis unit 14 may calculate the change $\Delta Q1$ in the charge amount when the voltage is increased from the power supply voltage $V_{CE}$ and the change $\Delta Q2$ in the charge amount when the voltage is decreased from the same power supply voltage $V_{CE}$. The first displacement voltage $\Delta V_{CE1}$ and the second displacement voltage $\Delta V_{CE2}$ may be the same or different. The charge amount analysis unit 14 may calculate a weighted average of $\Delta Q1$ and $\Delta Q2$ according to a ratio between the first displacement voltage $\Delta V_{CE1}$ and the second displacement voltage $\Delta V_{CE2}$. In this case, the capacitance calculation unit 16 may use, as the capacitance with respect to the power supply voltage $V_{CE}$, the inter-terminal capacitance $C_{GC}$ calculated from the average value $\Delta Q$ of the change in the charge amount. Also in this case, the C-V characteristic illustrated in FIG. 12 is obtained by changing each power supply voltage from the initial value.

In another example, the first power supply voltage $V_{CE1}$ and the second power supply voltage $V_{CE2}$ may be different voltages. For example, each voltage may be set such that the voltage $V_{CE1}+\Delta V_{CE1}$ obtained by adding the first displacement voltage $\Delta V_{CE1}$ to the first power supply voltage $V_{CE1}$ is equal to the voltage $V_{CE2}+\Delta V_{CE2}$ obtained by subtracting the second displacement voltage $\Delta V_{CE2}$ from the second power supply voltage $V_{CE2}$. That is, each voltage may be set such that the power supply voltages after the change become the same. The first displacement voltage $\Delta V_{CE1}$ and the second displacement voltage $\Delta V_{CE2}$ may be the same or may be different. The charge amount analysis unit 14 may calculate the change $\Delta Q1$ in the charge amount when the first displacement voltage $\Delta V_{CE1}$ is added to the first power supply voltage $V_{CE1}$ and the change $\Delta Q2$ in the charge amount when the second displacement voltage $\Delta V_{CE2}$ is subtracted from the second power supply voltage $V_{CE2}$. The capacitance calculation unit 16 may use, as a capacitance with respect to the voltage $V_{CE}1+\Delta V_{CE1}$ ($=V_{CE2}+\Delta V_{CE2}$), the inter-terminal capacitance $C_{GC}$ calculated from the average value of the changes $\Delta Q1$ and $\Delta Q2$ in charge amount. Also in this case, the C-V characteristic illustrated in FIG. 12 is obtained by changing each power supply voltage from the initial value.

The device simulator of the charge amount analysis unit 14 may have a convergence determination function of determining whether or not the process of analyzing the change in the charge amount converges. When the charge amount after changing the power supply voltage $V_{CE}$ by the displacement voltage $\Delta V_{CE}$ cannot be calculated within a set calculation period or to be less than or equal to a set calculation processing amount, the convergence determination function may determine that the analysis process does not converge. When the displacement voltage $\Delta V_{CE}$ is reduced, the analysis process is less likely to converge. On the other hand, as the displacement voltage $\Delta V_{CE}$ is smaller, the C-V characteristic can be analyzed with higher accuracy. The charge amount analysis unit 14 may set the displacement voltage to be as small as possible within a range where it is determined that the analysis process converges. The charge amount analysis unit 14 may set the smallest displacement voltage in a range where it is determined that the analysis process converges. The set displacement voltage may have a predetermined margin with respect to the minimum displacement voltage satisfying the condition. By setting the displacement voltage as small as possible, the C-V characteristic can be analyzed with higher accuracy.

Figure 14:
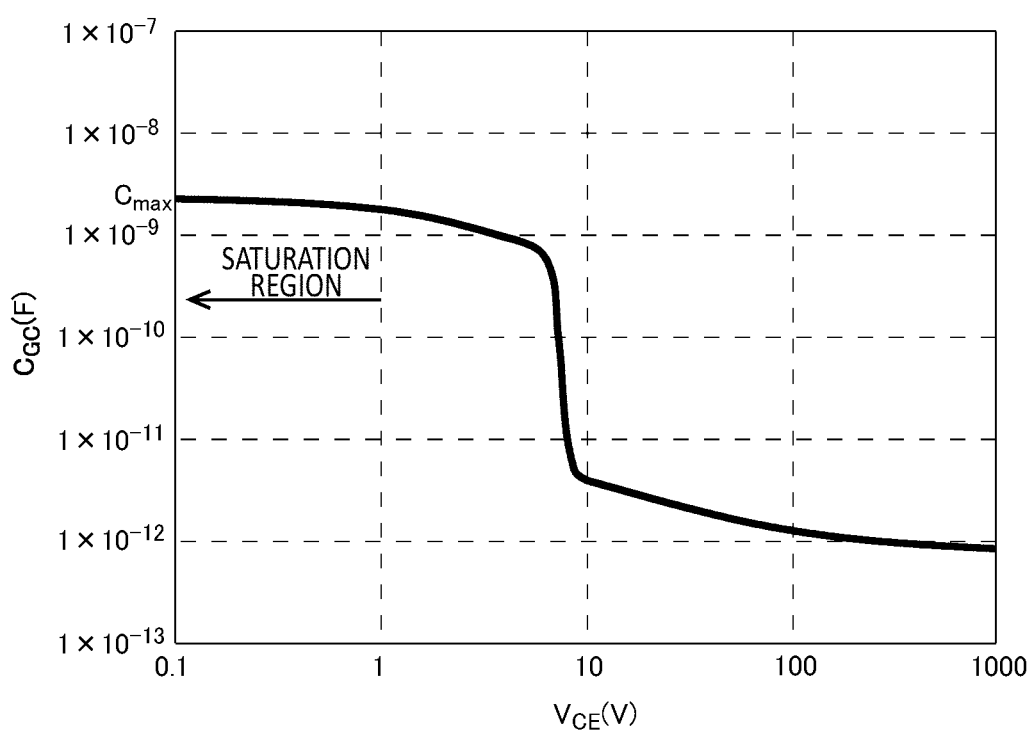
FIG. 14 is a diagram illustrating an example of a general C-V characteristic.

FIG. 14 is a diagram illustrating an example of a general C-V characteristic. In FIG. 14, a horizontal axis represents $V_{CE}$, and a vertical axis represents $C_{GC}$. The capacitance $C_{GC}$ may start to saturate when the power supply voltage $V_{CE}$ falls below a predetermined saturation voltage. A voltage at which the capacitance $C_{GC}$ becomes half of a maximum value $C_{max}$ when the power supply voltage $V_{CE}$ is lowered may be used as the saturation voltage. In the example of FIG. 14, the saturation voltage is about 1 V.

A region where the capacitance $C_{GC}$ is saturated in the vicinity of the maximum value $C_{max}$ corresponds to a region where the depletion layer does not expand in the off state of the semiconductor device 100. Since the analysis device 10 analyzes the C-V characteristic of the semiconductor device 100 in the on state, the charge amount analysis unit 14 may set the lower limit voltage of the variation range of the power supply voltage $V_{CE}$ according to the saturation voltage. The lower limit voltage may be a saturation voltage.

The charge amount analysis unit 14 may determine the displacement voltage $\Delta V_{CE}$ according to the saturation voltage. The charge amount analysis unit 14 may determine the displacement voltage $\Delta V_{CE}$ by multiplying the saturation voltage by a predetermined coefficient. For example, the coefficient may be 0.2 or less, may be 0.1 or less, or may be 0.01 or less. As a result, it is possible to set a sufficiently small displacement voltage $\Delta V_{CE}$ with respect to the lower limit of the variation range of the power supply voltage $V_{CE}$ to be measured. The saturation voltage may be set in advance by a user or the like, and may be analyzed by the charge amount analysis unit 14 on the basis of input information. The saturation voltage may be calculated by analyzing the C-V characteristic when the semiconductor device 100 is in the off state.

Figure 15:
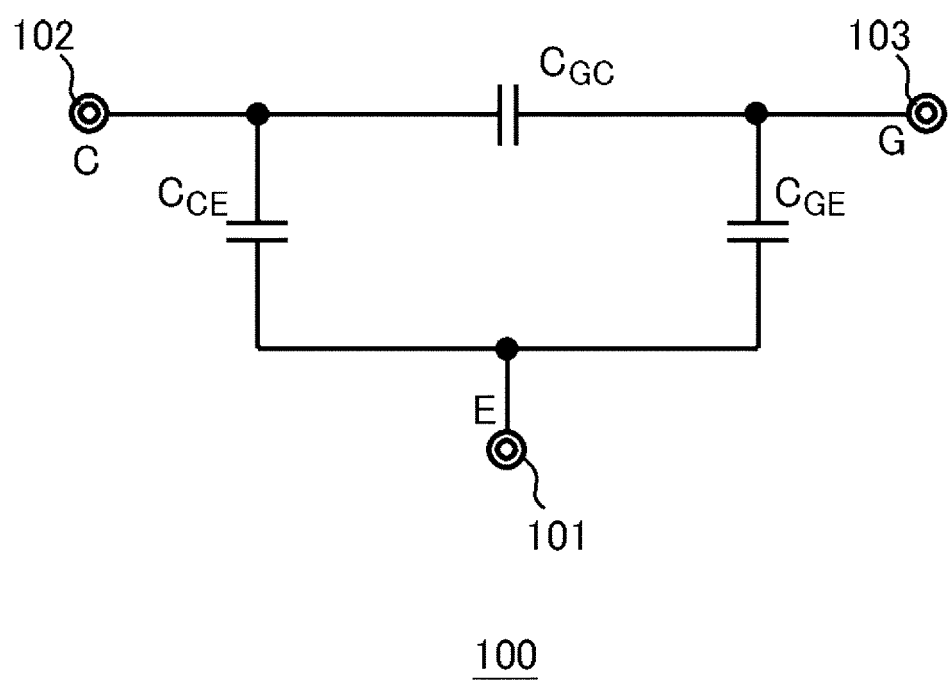
FIG. 15 is a diagram illustrating a measurement method according to a reference example.

FIG. 15 is a diagram illustrating a measurement method according to a reference example. In the measurement method of this example, a small signal voltage is applied to the semiconductor device 100 to measure a current flowing through the semiconductor device 100 and calculate impedance, thereby measuring the C-V characteristic. FIG. 15 is an equivalent circuit illustrating only a capacitance component of the semiconductor device 100. In the reference example, a flowing current is measured by applying an alternating small signal voltage to the capacitance C in which the C-V characteristic is to be measured.

Figure 16:
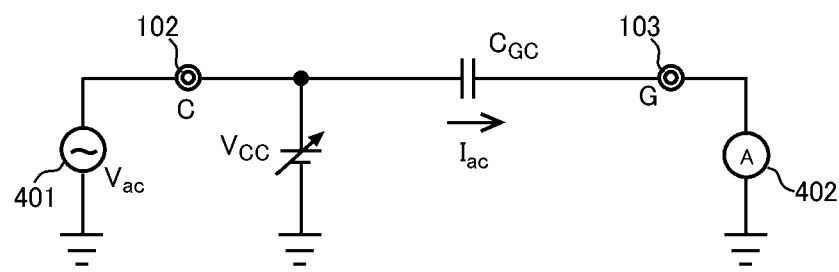
FIG. 16 is a diagram illustrating an example of a measurement circuit 405.

FIG. 16 is a diagram illustrating an example of a measurement circuit 405 used as the reference example. In this example, an example of measuring the capacitance $C_{GC}$ is shown, but other capacities C can also be measured in the same manner. When measuring the capacitance $C_{GC}$, the first main terminal 101 illustrated in FIG. 15 is connected to the ground potential via an AC guard that allows an AC signal to pass therethrough. As a result, the impedance of the capacitance $C_{GC}$ can be measured excluding the capacitance $C_{GE}$ and the capacitance $C_{CE}$.

In this example, a small signal source 401 and a power supply $V_{CC}$ are connected in parallel to the second main terminal 102. A voltage of $V=V_{CC}+V_{ac}$ is applied to the capacitance $C_{GC}$. In addition, an ammeter 402 is connected to the control terminal 103. On the basis of a current I measured by the ammeter 402 and the applied voltage V, the capacitance $C_{GC}$ can be calculated as in the following expression. $C_{GC}=I/j\omega V$ The C-V characteristic can be acquired by changing the power supply voltage $V_{CC}$ and measuring the capacitance $C_{GC}$. The information regarding the saturation voltage described in FIG. 14 may be acquired from the measurement result of the reference example.

Figure 17:
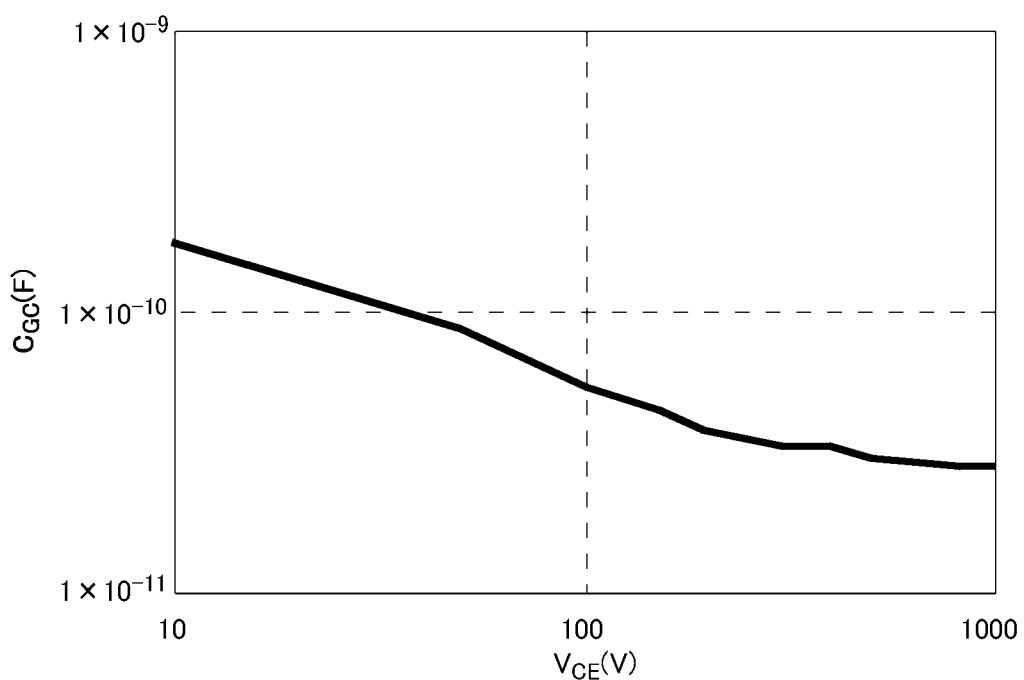
FIG. 17 is a diagram illustrating an example of the C-V characteristic calculated on the basis of the measurement circuit 405 illustrated in FIG. 16.

FIG. 17 is a diagram illustrating an example of the C-V characteristic calculated on the basis of the measurement circuit 405 illustrated in FIG. 16. In FIG. 17, a substantially appropriate C-V characteristic is obtained. However, as described above, the C-V characteristic is a characteristic when the semiconductor device 100 is in the off state. However, the C-V characteristic of the semiconductor device 100 may change between a case where the semiconductor device 100 is in the on state and a case where the semiconductor device is in the off state. The semiconductor device 100 is often used in the on state. Therefore, it is preferable that the C-V characteristic in the on state of the semiconductor device 100 can be analyzed.

Figure 18:
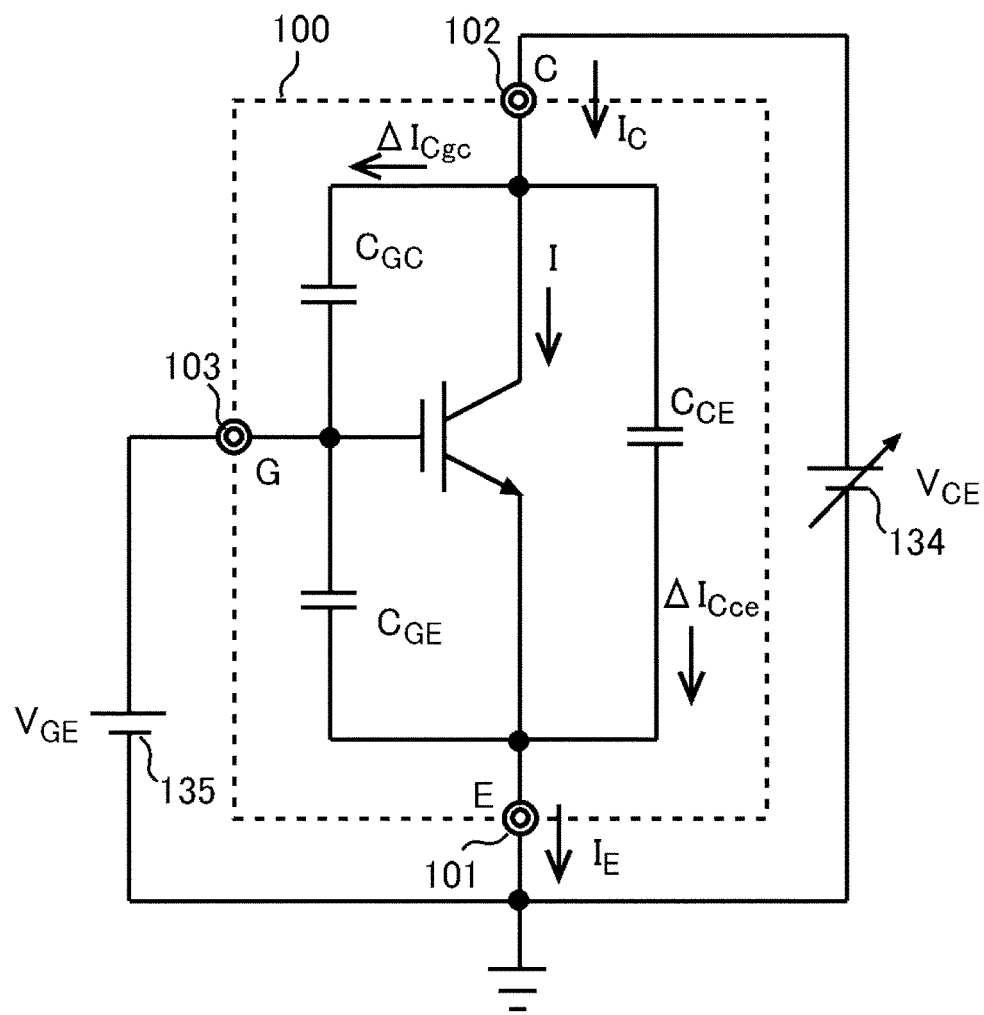
FIG. 18 illustrates a circuit 420 showing an operation when the semiconductor device 100 is in an on state in the reference example.

FIG. 18 illustrates a circuit 420 showing an operation when the semiconductor device 100 is in the on state in the reference example. In the circuit 420, the small signal source 401 is omitted. The circuit 420 analyzes the operation of the DC component.

As illustrated in FIG. 18, when the semiconductor device 100 is in the on state, the current $I_C$ flowing through the second main terminal 102 includes a main current I. Usually, the main current I is considerably larger than the current flowing through each capacitance when the power supply voltage $V_{CE}$ changes.

In such a case, when the terminal capacitance $C_{GC}$ is analyzed by using the equivalent circuit as illustrated in FIG. 16, the current $I_{ac}$ includes the component of the main current I in addition to the current flowing through each capacitance. Therefore, the apparent current amount becomes considerably large, and the terminal capacitance $C_{GC}$ becomes a considerably large value.

Figure 19:
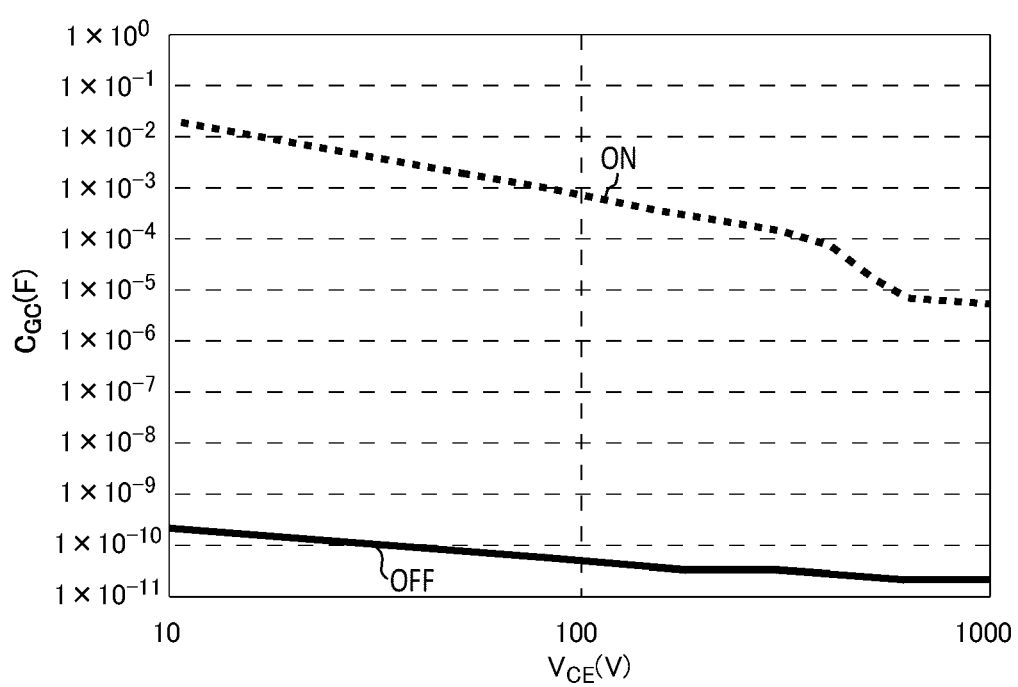
FIG. 19 illustrates an analysis value of a terminal capacitance $C_{GC}$ when the semiconductor device 100 is in the on state and an analysis value of the terminal capacitance $C_{GC}$ when the semiconductor device is in an off state.

FIG. 19 illustrates an analysis value of the terminal capacitance $C_{GC}$ when the semiconductor device 100 is in the on state and an analysis value of the terminal capacitance $C_{GC}$ when the semiconductor device is in the off state. As illustrated in FIG. 19, the analysis value of the terminal capacitance $C_{GC}$ in the on state is considerably larger than the analysis value of the terminal capacitance $C_{GC}$ in the off state. As described above, the analysis method of the reference example cannot accurately analyze the capacitance when the semiconductor device 100 is in the on state.

Figure 20:
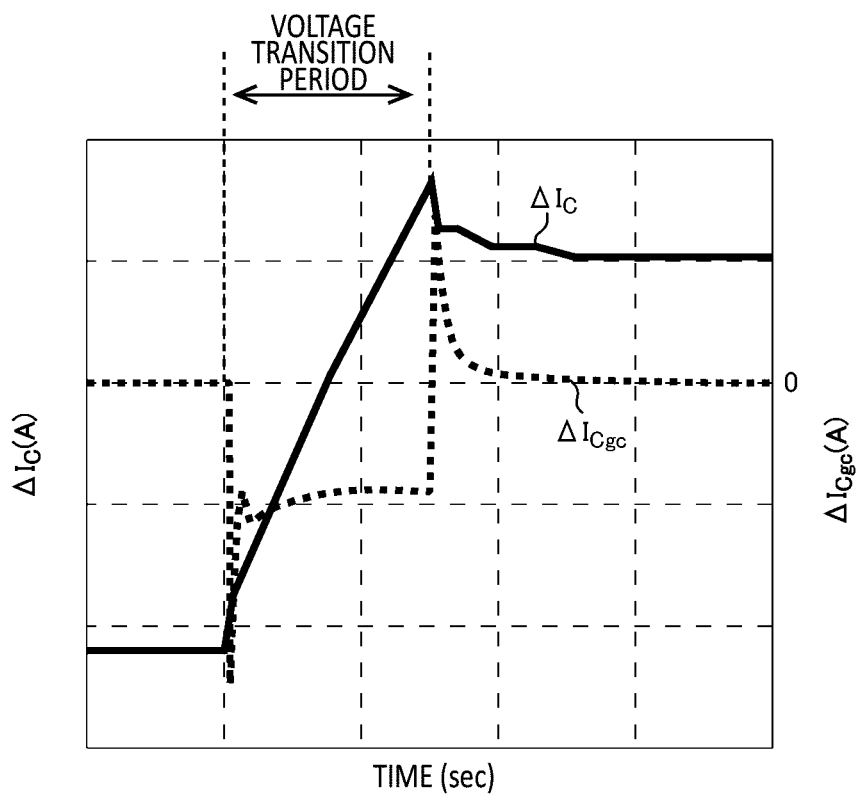
FIG. 20 is a diagram in which each current waveform is analyzed from a charge amount calculated by the analysis method explained in FIGS. 9 to 13.

FIG. 20 is a diagram in which each current waveform is analyzed from the charge amount calculated by the analysis method described in FIGS. 1A to 14. In FIG. 20, a period during which the power supply voltage is changed from $V_{CE}$ to $V_{CE}+\Delta V_{CE}$ is defined as a voltage transition period. FIG. 20 illustrates a change $\Delta I_C$ of the collector current flowing through the second main terminal 102 illustrated in FIG. 10 and a change $\Delta I_{Cgc}$ of the current flowing through the inter-terminal capacitance $C_{GC}$. The change $\Delta I_c$ is a difference of the current $I_c$ when the power supply voltage is changed. The change $\Delta I_{Cgc}$ can be calculated from the integrated value of the charges in the collector region 120.

As illustrated in FIG. 20, when the power supply voltage is increased, the collector current $I_C$ increases as the main current increases. On the other hand, the current $I_{Cgc}$ flowing through the inter-terminal capacitance $C_{GC}$ varies in the voltage transition period, but is substantially zero in periods other than the voltage transition period. As illustrated in FIG. 20, the charge amount calculated by the analysis method described in FIGS. 1A to 14 does not include the charge contributing to the collector current $I_C$. Therefore, the C-V characteristic in the on state of the semiconductor device 100 can be accurately analyzed. The C-V characteristic in the on state illustrated in FIG. 12 has a small difference from the C-V characteristic in the off state illustrated in FIG. 19, and is a substantially appropriate value. Since the charge calculated in the analysis method does not include the charge contributing to the collector current $I_C$, the terminal capacitance $C_{CG}$ an be calculated without affecting the collector current $I_C$.

Figure 21:
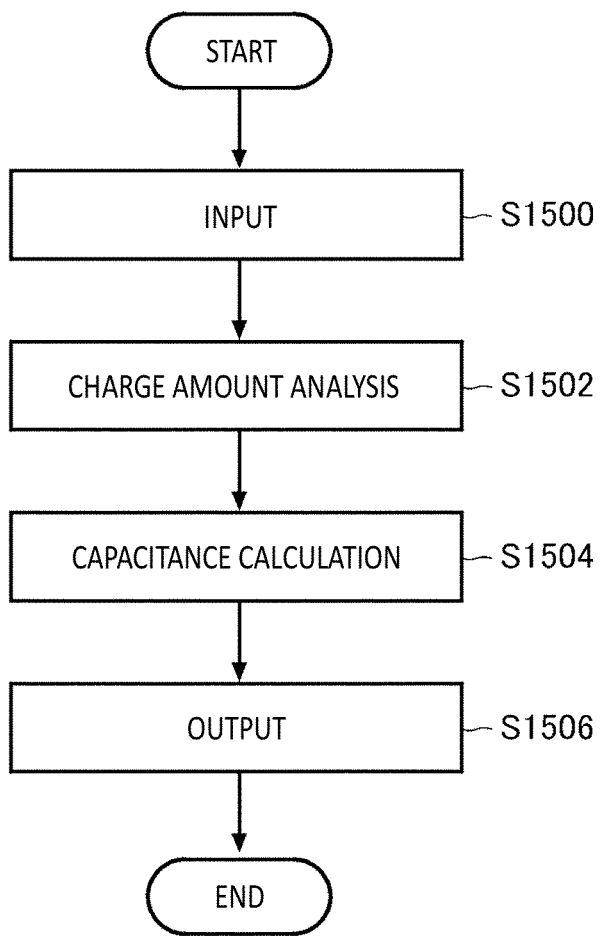
FIG. 21 is a flowchart illustrating an example of an analysis method using the analysis device 10 illustrated in FIGS. 9 to 13.

FIG. 21 is a flowchart illustrating an example of the analysis method using the analysis device 10 illustrated in FIGS. 1A to 14. In the analysis method, each process described in FIGS. 1A to 14 may be appropriately performed. The analysis method includes an input step S1500, a charge amount analysis step S1502, a capacitance calculation step S1504, and an output step S1506.

The process in the input step S1500 is similar to the process of the input unit 12. The process in the charge amount analysis step S1502 is similar to the process of the charge amount analysis unit 14. The process in the capacitance calculation step S1504 is similar to the process of the capacitance calculation unit 16. The process in the output step S1506 is similar to the process of the output unit 18.

Figure 22:
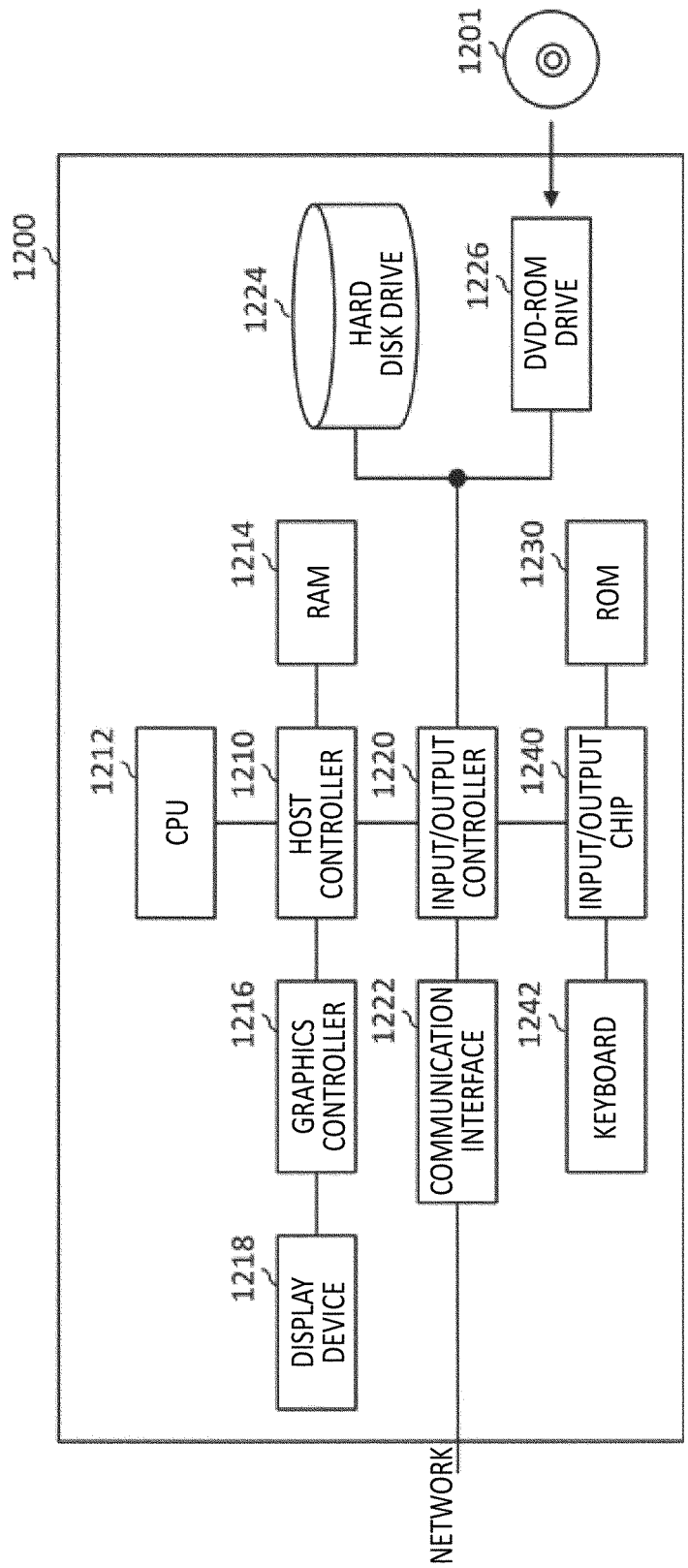
FIG. 22 illustrates a configuration example of a computer 1200 in which a plurality of aspects of the present invention may be embodied in whole or in part.

FIG. 22 illustrates a configuration example of a computer 1200 in which a plurality of aspects of the present invention may be embodied in whole or in part. A program installed on the computer 1200 can cause the computer 1200 to function as an operation associated with a device according to embodiments of the present invention or as one or more "unit(s)" of the device, or to perform the operation or the one or more "unit(s)", and/or can cause the computer 1200 to perform processes according to embodiments of the present invention or steps of the processes. Such a program may be executed by a CPU 1212 to cause the computer 1200 to perform particular operations associated with some or all blocks in the flowcharts or block diagrams described herein. Processes according to embodiments of the present invention or steps of the processes may also be performed on a cloud network or the like.

The computer 1200 according to the present embodiment includes a CPU 1212, a RAM 1214, a graphics controller 1216 and a display device 1218, which are connected to each other by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates in accordance with programs stored in the ROM 1230 and the RAM 1214, and controls each unit accordingly. The graphic controller 1216 is configured to acquire image data generated by the CPU 1212 on a frame buffer or the like provided in the RAM 1214 or in the graphic controller 1216 itself, and to cause the image data to be displayed on the display device 1218.

The communication interface 1222 communicates with other electronic devices via a network. The hard disk drive 1224 stores programs and data to be used by the CPU 1212 in the computer 1200. The DVD-ROM drive 1226 reads programs or data from the DVD-ROM 1201, and provides the programs or data to the hard disk drive 1224 via the RAM 1214. The IC card drive reads programs and data from an IC card and/or writes programs and data into the IC card.

The ROM 1230 has stored therein a boot program or the like to be executed by the computer 1200 at the time of activation, and/or a program that depends on the hardware of the computer 1200. The input/output chip 1240 may also connect various input/output units to the input/output controller 1220 via a parallel port, a serial port, a keyboard port, a mouse port or the like.

Programs are provided by a computer-readable storage medium such as the DVD-ROM 1201 or an IC card. The programs are read from the computer-readable storage medium, installed on the hard disk drive 1224, the RAM 1214 or the ROM 1230, which are also examples of a computer-readable storage medium, and executed by the CPU 1212. The information processing described in the programs is read into the computer 1200, resulting in cooperation between the programs and the above various types of hardware resources. A device or method may be constituted by implementing the operation or processing of information in accordance with the use of the computer 1200.

For example, if communication is made between the computer 1200 and external devices, the CPU 1212 may execute a communication program loaded on the RAM 1214, and instruct the communication interface 1222 to perform communication processing based on the processing described in the communication program. Under the control of the CPU 1212, the communication interface 1222 reads transmission data stored in a transmission buffer region provided in a recording medium such as the RAM 1214, the hard disk drive 1224, the DVD-ROM 1201 or an IC card, and sends the read transmission data to the network, or writes reception data received from the network into a reception buffer region or the like provided in the recording medium.

The CPU 1212 may also make all or required portions of the files or databases stored in an external recording medium such as the hard disk drive 1224, the DVD-ROM drive 1226 (DVD-ROM 1201) or an IC card to be read by the RAM 1214, and perform various types of processing on the data on the RAM 1214. Then, the CPU 1212 may write back the processed data to the external recording medium.

Various types of information such as various types of programs, data, tables and databases may be stored in the recording medium for information processing. The CPU 1212 may perform various types of processing on the data read from the RAM 1214, which includes various types of operations, information processing, condition judging, conditional branch, unconditional branch, search/replacement of information, etc., as described throughout this disclosure and specified by an instruction sequence of programs, and writes the result back to the RAM 1214. In addition, the CPU 1212 may search for information in a file, a database, etc., in the recording medium. For example, when a plurality of entries each having the attribute value of a first attribute associated with the attribute value of a second attribute is stored in the recording medium, the CPU 1212 may search for an entry matching a condition in which the attribute value of the first attribute is designated from the plurality of entries, read the attribute value of the second attribute stored in the entry, and thus acquire the attribute value of the second attribute associated with the first attribute satisfying a predetermined condition.

The programs or software modules in the above description may be stored on the computer 1200 or a computer-readable storage medium near the computer 1200. Further, a recording medium such as a hard disk or a RAM provided in a server system connected to a dedicated communication network or the Internet can be used as a computer-readable storage media, which provides programs to the computer 1200 via the network.

While the present invention have been described with the embodiments, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

Note that the operations, procedures, steps, and stages of each process performed by a device, system, program, and method shown in the scope of the claims, specification, or drawings can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

What is claimed is:

1. A semiconductor device comprising:
    a semiconductor substrate having an upper surface and a lower surface and having a drift region of a first conductivity type;
    a first main terminal provided above the upper surface;
    a second main terminal provided below the lower surface;
    a control terminal configured to control whether or not to cause a current to flow between the first main terminal and the second main terminal; and
    a buffer region provided between the drift region and the lower surface and having a higher doping concentration than the drift region, wherein
    in a C-V characteristic curve indicating a relationship between a power supply voltage applied between the first main terminal and the second main terminal and an inter-terminal capacitance between the control terminal and the second main terminal, the C-V characteristic curve has a peak of the inter-terminal capacitance in a region where the power supply voltage is 500 V or more.

2. The semiconductor device according to claim 1, wherein
    the C-V characteristic has a valley portion in which the inter-terminal capacitance exhibits a minimum value in a region where the power supply voltage is less than 500 V, and
    the inter-terminal capacitance when the power supply voltage is 500 V is larger than the minimum value.

3. The semiconductor device according to claim 2, wherein
    a doping concentration distribution of the buffer region in a depth direction has one or less doping concentration peaks.

4. The semiconductor device according to claim 2, further comprising:
    a plurality of trench portions disposed side by side in an arrangement direction on the upper surface of the semiconductor substrate and provided from the upper surface of the semiconductor substrate to the drift region; and
    a mesa portion sandwiched between two trench portions, wherein
    a width of the mesa portion in the arrangement direction is 20% or less of a depth of the trench portion.

5. The semiconductor device according to claim 1, wherein
    the C-V characteristic curve is a characteristic curve acquired by stabilizing a current flowing between the first main terminal and the second main terminal in a state where the semiconductor device is set to an on state and the power supply voltage applied between the first main terminal and the second main terminal is set to an initial voltage, then analyzing, by a device simulator simulating a transient change in a charge in the semiconductor device, a change in a charge amount in any of terminals when the power supply voltage is changed by a displacement voltage smaller than the initial voltage, and calculating the inter-terminal capacitance on a basis of the analyzed change in the charge amount.

6. The semiconductor device according to claim 5, wherein
    a doping concentration distribution of the buffer region in a depth direction has one or less doping concentration peaks.

7. The semiconductor device according to claim 5, further comprising:
    a plurality of trench portions disposed side by side in an arrangement direction on the upper surface of the semiconductor substrate and provided from the upper surface of the semiconductor substrate to the drift region; and
    a mesa portion sandwiched between two trench portions, wherein
    a width of the mesa portion in the arrangement direction is 20% or less of a depth of the trench portion.

8. The semiconductor device according to claim 1, further comprising
    a base region of a second conductivity type which is provided to face the control terminal and in which an inversion layer channel is formed in a channel region facing the control terminal when a control voltage is applied to the control terminal, wherein
    the buffer region has an increase region in which a doping concentration monotonously increases from a boundary with the drift region toward the lower surface, and
    a gradient $\alpha$ at which a value of a common logarithm of the doping concentration in the increase region increases per 1 cm in a depth direction and a total length $\beta$ of the channel region satisfy a following expression $$\beta > 2 \times 10^3 / \alpha.$$

9. The semiconductor device according to claim 8, wherein
    in the increase region, a doping concentration distribution is flatter than a hydrogen chemical concentration distribution.

10. The semiconductor device according to claim 8, wherein
a doping concentration distribution of the buffer region in the depth direction has one or less doping concentration peaks.

11. The semiconductor device according to claim 1, wherein
a doping concentration distribution of the buffer region in a depth direction has one or less doping concentration peaks.

12. The semiconductor device according to claim 11, wherein
a hydrogen chemical concentration distribution of the buffer region in the depth direction has more hydrogen concentration peaks than the doping concentration peaks.

13. The semiconductor device according to claim 1, further comprising:
a plurality of trench portions disposed side by side in an arrangement direction on the upper surface of the semiconductor substrate and provided from the upper surface of the semiconductor substrate to the drift region; and
a mesa portion sandwiched between two trench portions, wherein
a width of the mesa portion in the arrangement direction is 20% or less of a depth of the trench portion.

14. The semiconductor device according to claim 13, wherein
a width of the mesa portion is 1.1 μm or less.

15. A semiconductor device comprising:
a semiconductor substrate having an upper surface and a lower surface and having a drift region of a first conductivity type;
a first main terminal provided above the upper surface;
a second main terminal provided below the lower surface;
a control terminal configured to control whether or not to cause a current to flow between the first main terminal and the second main terminal;
a buffer region provided between the drift region and the lower surface and having a higher doping concentration than the drift region; and
a base region of a second conductivity type which is provided to face the control terminal and in which an inversion layer channel is formed in a channel region facing the control terminal when a control voltage is applied to the control terminal, wherein
the buffer region has an increase region in which a doping concentration monotonously increases from a boundary with the drift region toward the lower surface, and
a gradient $\alpha$ at which a value of a common logarithm of the doping concentration in the increase region increases per 1 cm in a depth direction and a total length $\beta$ of the channel region satisfy a following expression $\beta > 2 \times 10^3 / \alpha$.

16. The semiconductor device according to claim 15, wherein
a doping concentration distribution of the buffer region in the depth direction has one or less doping concentration peaks.

17. The semiconductor device according to claim 16, wherein
a hydrogen chemical concentration distribution of the buffer region in the depth direction has more hydrogen concentration peaks than the doping concentration peaks.

18. The semiconductor device according to claim 15, further comprising:
a plurality of trench portions disposed side by side in an arrangement direction on the upper surface of the semiconductor substrate and provided from the upper surface of the semiconductor substrate to the drift region; and
a mesa portion sandwiched between two trench portions, wherein
a width of the mesa portion in the arrangement direction is 20% or less of a depth of the trench portion.

19. The semiconductor device according to claim 18, wherein
a width of the mesa portion is 1.1 μm or less.

20. The semiconductor device according to claim 15, wherein
in the increase region, a doping concentration distribution is flatter than a hydrogen chemical concentration distribution.

* * * * *